United States Patent
Imamura et al.

(10) Patent No.: US 8,182,641 B2
(45) Date of Patent: May 22, 2012

(54) BONDING METHOD AND BONDED STRUCTURE

(75) Inventors: Minehiro Imamura, Suwa (JP); Kazuhiro Gomi, Chino (JP)

(73) Assignee: Seiko Epson Corporation (JP)

( * ) Notice: Subject to any disclaimer, the term of this patent is extended or adjusted under 35 U.S.C. 154(b) by 246 days.

(21) Appl. No.: 12/729,533

(22) Filed: Mar. 23, 2010

(65) Prior Publication Data
US 2010/0243134 A1    Sep. 30, 2010

(30) Foreign Application Priority Data

Mar. 26, 2009    (JP) ................. 2009-077813

(51) Int. Cl.
| | |
|---|---|
| B32B 7/14 | (2006.01) |
| B32B 37/06 | (2006.01) |
| B32B 37/10 | (2006.01) |
| B32B 38/10 | (2006.01) |
| B29C 65/52 | (2006.01) |
| B32B 37/02 | (2006.01) |
| B32B 38/18 | (2006.01) |

(52) U.S. Cl. ......... 156/291; 156/289; 156/290; 156/295
(58) Field of Classification Search ............... 156/275.7, 156/589, 289–291, 295; 428/447
See application file for complete search history.

(56) References Cited

U.S. PATENT DOCUMENTS
5,444,557 A * 8/1995 Spitzer et al. ............ 349/42

FOREIGN PATENT DOCUMENTS
| JP | 05082404 A | * | 4/1993 |
|---|---|---|---|
| JP | 11158437 A | * | 6/1999 |
| JP | 2006-289226 | | 10/2006 |
| JP | 2006289226 A | * | 10/2006 |

OTHER PUBLICATIONS

English Translation of JP05082404A; Apr. 1993.*
English Translation of JP11158437A; Jun. 1999.*
English Translation of JP2006289226A; Oct. 2006.*

* cited by examiner

Primary Examiner — Sonya Mazumdar
(74) Attorney, Agent, or Firm — Harness, Dickey & Pierce, P.L.C.

(57) ABSTRACT

A method includes: preparing a transfer base material to have repellency against a silicone material- and conductive particle-containing liquid material; applying the liquid material to a transfer base material surface to form a liquid coating, and drying the liquid coating to obtain a bonding film; imparting energy to the bonding film to develop adhesion near a surface thereof, bonding the transfer base material to a first base material, and then separating the transfer and first base materials to transfer the bonding film to the first base material; thereafter imparting energy to the bonding film to develop adhesion near another surface of the bonding film, and bonding the first base material to a second base material to obtain a temporarily bonded structure; and applying pressure to the temporarily bonded structure to finalize the bonding and electrically connect a first terminal and a second terminal via the conductive particles.

20 Claims, 11 Drawing Sheets

PLASMA

BONDING METHOD AND BONDED STRUCTURE

This application claims priority to Japanese Patent Application No. 2009-077813 filed Mar. 26, 2009 which is hereby expressly incorporated by reference herein in its entirety.

BACKGROUND

1. Technical Field

The present invention relates to bonding methods and bonded structures.

2. Related Art

Methods of forming a film on a substrate in patterns of a predetermined shape are known. For example, JP-A-2006-289226 discloses a method in which a liquid material that contains the film material is applied onto a substrate in a predetermined shape to form a patterned liquid coating, which is then dried to form a film in patterns of the predetermined shape.

The method of forming a patterned film using such liquid materials has application in electrically bonding the conductive terminals of two substrates together, in which case a bonding film containing a heat- or light-curable resin and conductive particles is formed on the terminal of the substrate in a predetermined shape.

However, the method in which the liquid material is applied onto such terminals is problematic in that, depending on the wettability of the liquid material for the substrate, the liquid coating applied in the predetermined shape spreads over the substrate, and thus lowers the patterning accuracy of the resulting film.

SUMMARY

An advantage of some aspects of the present invention is to provide a bonding method by which the terminals of two substrates can be bonded to each other with a bonding film that has been patterned with high deposition accuracy, and a bonded structure including a bonding film bonded by the bonding method.

The foregoing advantage can be realized by the following aspects.

A bonding method according to one aspect includes:

(1) preparing a transfer base material having liquid repellency against a silicone material- and conductive particle-containing liquid material at least near a surface, and a first base material having a first terminal and a second base material having a second terminal that are to be electrically bonded to each other via a bonding film;

(2) applying the liquid material to a liquid repellency-imparted surface of the transfer base material to form a liquid coating in patterns of a predetermined shape, and drying the liquid coating to obtain a bonding film patterned into the predetermined shape;

(3) imparting energy to the bonding film to develop adhesion near a surface of the bonding film, and bonding the transfer base material and the first base material to each other via the bonding film, and then separating the transfer base material and the first base material from each other to transfer the bonding film from the transfer base material to the first base material;

(4) imparting energy to the bonding film after the transfer to develop adhesion near a surface of the bonding film, and bonding the first base material and the second base material to each other via the bonding film to obtain a temporarily bonded structure of the first base material and the second base material; and (5) applying pressure to the temporarily bonded structure in a thickness direction of the bonding film to finalize the bonding between the first base material and the second base material via the bonding film and electrically connect the first terminal and the second terminal via the conductive particles contained in the bonding film, so as to obtain a bonded structure.

In this way, the first terminal of the first base material and the second terminal of the second base material can be electrically bonded to each other via the bonding film that has been patterned with high deposition accuracy.

In the bonding method according to the one aspect, it is preferable that the first terminal and the second terminal be provided at such positions as to overlap and face each other upon mating of the first base material and the second base material on the first and second terminals.

By bonding the first and second base materials of such configurations using a bonding method of the one aspect, the first and second terminals can be electrically connected to each other via the bonding film.

In the bonding method according the one aspect, it is preferable that the predetermined shape correspond in shape to the first terminal upon transfer of the bonding film to the first base material in step (3).

In this way, the first and second terminals can be electrically connected to each other with the bonding film provided to correspond to the first terminal.

In the bonding method according to the one aspect, it is preferable that, in step (2), a bonding film containing no conductive particles is formed on the first base material over substantially an entire surface to be bonded to the second base material via the bonding film.

In this way, the bonding by the bonding film can be further strengthened.

In the bonding method according to the one aspect, it is preferable that, in step (2), a bonding film containing no conductive particles is formed on the second base material over substantially an entire surface to be bonded to the first base material via the bonding film.

In this way, the bonding by the bonding film can be further strengthened.

In the bonding method according to the one aspect, it is preferable that, in step (2), the liquid coating is formed by supplying the liquid material in droplets using a droplet discharge method.

With the droplet discharge method, the bonding film can be formed with improved deposition accuracy.

In the bonding method according to the one aspect, it is preferable that the droplet discharge method be an inkjet method by which the liquid material is discharged in droplets through a nozzle hole of an inkjet head using vibration of a piezoelectric element.

With the inkjet method, the liquid material can be supplied to a target region (position) in droplets with excellent positional accuracy. Further, because the size (volume) of the droplets can be adjusted with relative ease by appropriately setting parameters such as the vibration frequency of the piezoelectric element and the viscosity of the liquid material, the liquid coating can be reliably formed in a shape corresponding to the predetermined shape by reducing the size of the droplets, even when the predetermined shape has microscopic dimensions.

In the bonding method according to the one aspect, it is preferable that the silicone material have a main backbone of polydimethylsiloxane, and that the main backbone is branched.

In this way, the branch chains of the silicone material tangle together to form the bonding film, and thus the resulting bonding film has particularly high film strength.

In the bonding method according to the one aspect, it is preferable that at least one of the methyl groups of the polydimethylsiloxane in the silicone material be substituted with a phenyl group.

In this way, the film strength of the bonding film can be further improved.

In the bonding method according to the one aspect, it is preferable that the silicone material include a plurality of silanol groups.

In this way, the hydroxyl group of the silicone material and the hydroxyl group of the polyester resin can reliably bind to each other, and the polyester-modified silicone material can be reliably synthesized by the dehydrocondensation reaction between the silicone material and the polyester resin.

Further, because the hydroxyl groups contained in the silanol groups of adjacent silicone materials bind together when the liquid coating is dried to obtain the bonding film, the resulting bonding film excels in film strength.

In the bonding method according to the one aspect, it is preferable that the silicone material be a polyester-modified silicone material obtained by a dehydrocondensation reaction with polyester resin.

In this way, the film strength of the bonding film can be further improved.

In the bonding method according to the one aspect, it is preferable that the polyester resin be the product of esterification reaction between saturated polybasic acid and polyalcohol.

In this way, by appropriately selecting the materials of the base particles and the conductive film, parameters such as the shape, size (for example, average particle diameter), and property (for example, conductivity, density) of the conductive particles can be easily adjusted.

In the bonding method according to the one aspect, it is preferable that the conductive particles include base particles, and a conductive film that covers a surface of the base particles.

In this way, it is possible to prevent the agglomeration of the conductive particles in the liquid material caused when the average particle diameter of the conductive particles is too small. It is also possible to prevent the high probability of the contact between the conductive particles or between the conductive particles and the base materials in the liquid coating under no compression, which may occur when the average particle diameter of the conductive particles is too large.

In the bonding method according to the one aspect, it is preferable that the conductive particles have an average particle diameter of 0.3 to 100 µm.

In this way, it is possible to prevent the agglomeration of the conductive particles in the liquid material caused when the average particle diameter of the conductive particles is too small. It is also possible to prevent the high probability of the contact between the conductive particles or between the conductive particles and the first and second terminals in the bonding film under no compression, which may occur when the average particle diameter of the conductive particles is too large.

In the bonding method according to the one aspect, it is preferable that the bonding film have an average thickness of 0.5 to 500 µm.

In this way, the first and second base materials can be bonded to each other more strongly, while preventing a large decrease in the dimensional accuracy of the bonded structure.

In the bonding method according to the one aspect, it is preferable that, in steps (3) and (4), energy be imparted to the bonding film by contacting a plasma with the bonding film.

In this way, the bonding film can be activated in an extremely short time period (for example, on the order of several seconds), making it possible to produce the bonded structure in a short amount of time.

In the bonding method according to the one aspect, it is preferable that the plasma contact be performed under atmospheric pressure.

In the plasma contact performed under atmospheric pressure, or specifically in an atmospheric pressure plasma treatment, the environment surrounding the bonding film is not reduced pressure. Thus, for example, the methyl groups of the polydimethylsiloxane backbone in the bonding film-forming polyester-modified silicone material will not be unnecessarily cut when these methyl groups are subjected to cutting and removal by the action of plasma to develop adhesion near the surface of the bonding film.

In the bonding method according to the one aspect, it is preferable that the plasma contact be performed by supplying a plasma gas to the bonding film, wherein the plasma gas is produced by introducing a gas between opposing electrodes under applied voltage between the electrodes.

In this way, the plasma can easily and reliably contact the bonding film, and adhesion can be reliably developed near the surface of the bonding film.

In the bonding method according to the one aspect, it is preferable that the first terminal and the second terminal be subjected in advance to a surface treatment that improves adhesion for the bonding film.

In this way, the surface of the terminals can be particularly optimized for the bonding film formation.

A bonded structure according to another aspect includes:
a first base material including a first terminal;
a second base material including a second terminal; and
a bonding film including conductive particles,
wherein the first base material and the second base material are bonded to each other via the bonding film formed by the bonding method of the one aspect, and
wherein the first terminal and the second terminal are electrically connected to each other via the conductive particles.

In this way, a highly reliable bonded structure can be obtained.

BRIEF DESCRIPTION OF THE DRAWINGS

Embodiments of the invention will be described with reference to the accompanying drawings, wherein like numbers reference like elements.

FIGS. 2A and 2B are diagrams illustrating a droplet discharge head of the droplet discharge apparatus illustrated in FIG. 1, in which FIG. 2A is a cross sectional perspective view, and FIG. 2B is a cross sectional view.

DESCRIPTION OF EXEMPLARY EMBODIMENTS

Bonding methods and bonded structures are described in detail based on preferred embodiments represented by the accompanying drawings.

Prior to explaining bonding methods and bonded structures according to preferred embodiments, an example of a droplet discharge apparatus used to supply a liquid material with a bonding method is described first.

Droplet Discharge Apparatus

Figure 1:
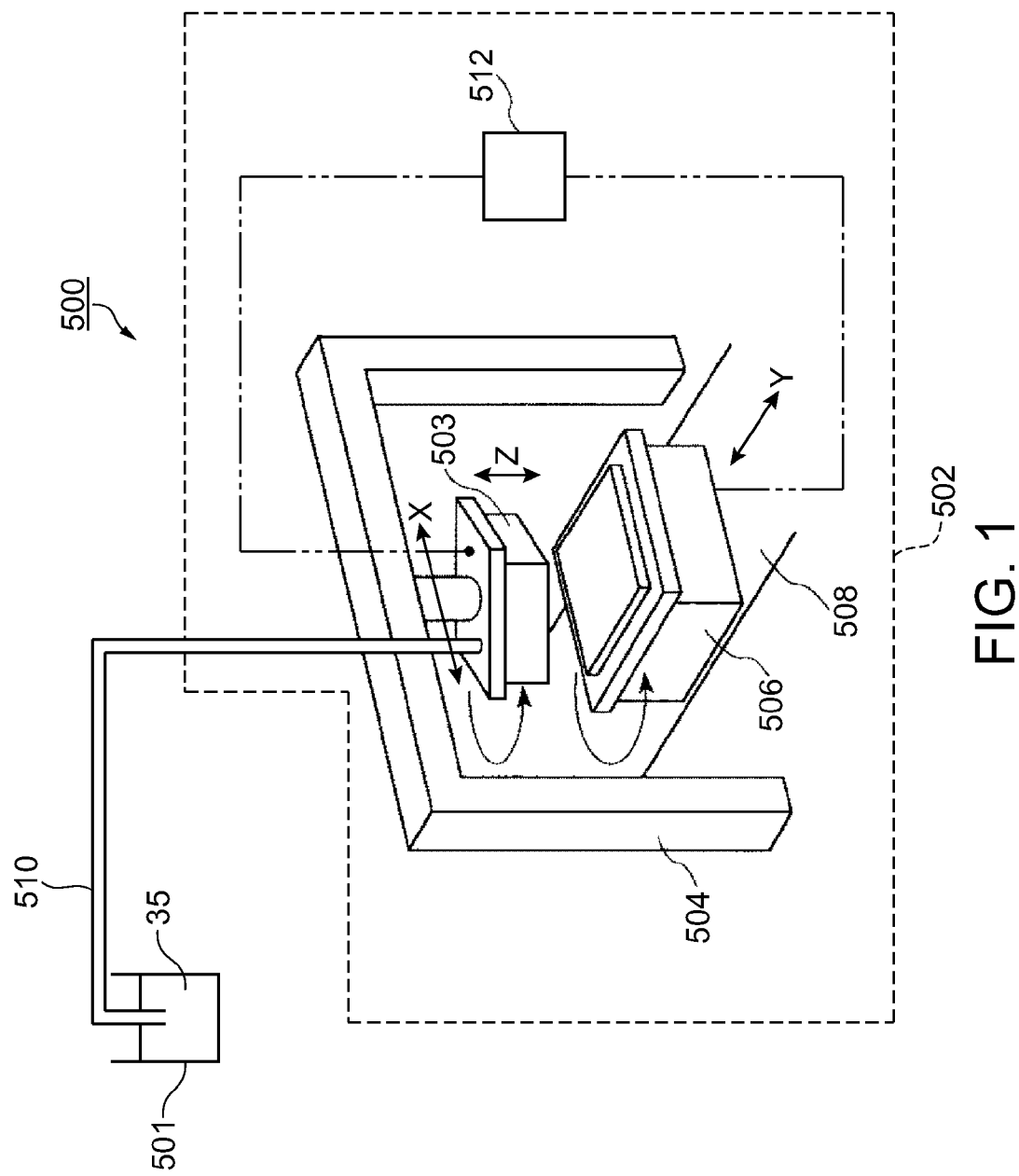
FIG. 1 is a perspective view illustrating a droplet discharge apparatus used to apply a liquid material onto a transfer base material.
Figure 2A:
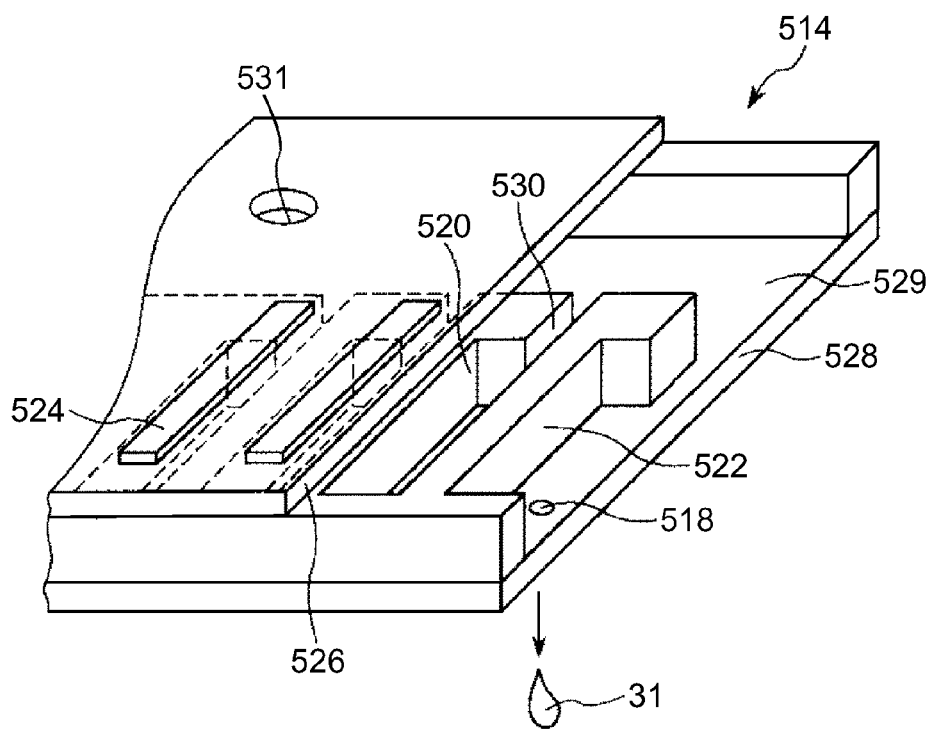
Figure 2B:
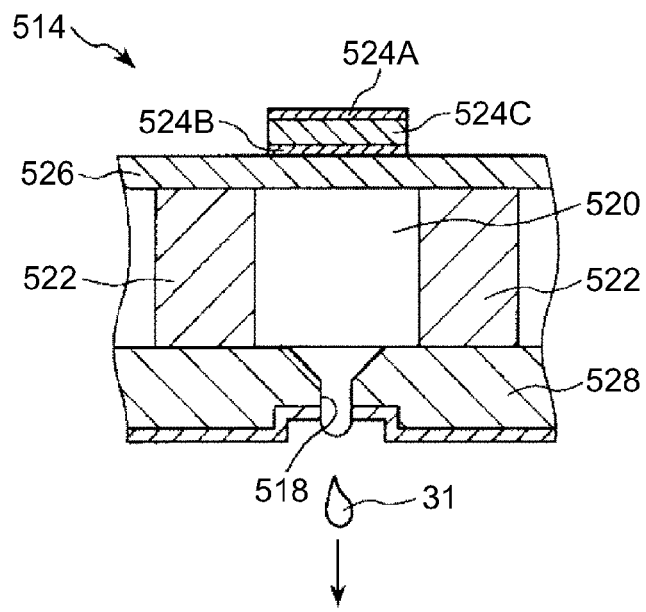

FIG. 1 is a perspective view of a droplet discharge apparatus used to apply a liquid material onto a transfer base material. FIGS. 2A and 2B are diagrams illustrating a droplet discharge head of the droplet discharge apparatus shown in FIG. 1, in which FIG. 2A is a cross sectional perspective view, and FIG. 2B is a cross sectional view.

As illustrated in FIG. 1, a droplet discharge apparatus 500 used in the presently described step includes a tank 501 provided as a reservoir for a liquid material 35 used to form a bonding film 3 (described later), a tube 510, and a discharge scan section 502 to which the liquid material 35 is supplied from the tank 501 through the tube 510. The discharge scan section 502 includes a droplet discharger 503 provided with a droplet discharge head (inkjet head) 514, a first position control unit 504 (moving unit) that controls the position of the droplet discharger 503, a stage 506 that holds a transfer base material 21 on which the bonding film 3 is formed, a second position control unit 508 (moving unit) that controls the position of the stage 506, and a controller 512. The tank 501 and the droplet discharge head 514 of the droplet discharger 503 are joined to each other via the tube 510, and the liquid material 35 is supplied into the droplet discharge head 514 from the tank 501 by compressed air.

The controller (control unit) 512 is realized by a computer, for example, such as a microcomputer or a personal computer, with elements such as an arithmetic section and memory installed therein. The controller 512 receives signals (inputs) from an operation section (not illustrated), as desired.

Further, the controller 512 controls the operation (driving) of each section of the droplet discharge apparatus 500 according to preset programs, based on signals or some other form of information from the operation section.

The first position control unit 504 moves the droplet discharger 503 along the X-axis direction and the Z-axis direction orthogonal to the X-axis direction according to signals from the controller 512. Further, the first position control unit 504 functions to rotate the droplet discharger 503 about an axis parallel to the Z axis. In the present embodiment, the Z-axis direction is the direction parallel to the vertical direction (the direction of gravitational acceleration). The second position control unit 508 moves the stage 506 along the Y-axis direction orthogonal to the X- and Z-axis directions according to signals from the controller 512. Further, the second position control unit 508 functions to rotate the stage 506 about an axis parallel to the Z axis.

The stage 506 has a flat surface parallel to the X- and Y-axis directions. Further, the stage 506 is configured so that the transfer base material 21 to which the liquid material 35 is applied to form the bonding film 3 can be fastened or held on the flat surface.

As described above, the droplet discharger 503 is moved by the first position control unit 504 along the X-axis direction. The stage 506 is moved by the second position control unit 508 along the Y-axis direction. That is, the first position control unit 504 and the second position control unit 508 change the relative position of the droplet discharge head 514 relative to the stage 506 (relative movement between the droplet discharger 503 and the transfer base material 21 held on the stage 506).

The controller 512 is configured to receive discharge data indicative of the relative discharge position of the liquid material 35 from an external information processor.

To supply the liquid material 35 onto the transfer base material 21, the liquid material 35 is discharged onto the transfer base material 21 by the relative scan of the droplet discharge head 514 and the transfer base material 21. Specifically, the second position control unit 508 is activated to move the stage 506 with the transfer base material 21 along the Y-axis direction. As the stage 506 passes underneath the droplet discharger 503, droplets (ink droplets) 31 of the liquid material 35 are discharged (spit) onto a film forming region 41 of the transfer base material 21 through nozzles 518 of the droplet discharge head 514 of the droplet discharger 503. In the following description, this operation is also referred to as the "apply scan (main scan between the droplet discharge head 514 and the transfer base material 21)."

In the step of supplying the liquid material 35 onto the transfer base material 21, the apply scan (scan) is generally performed multiple times. The apply scan, however, may be performed only once.

In the present embodiment, the droplet discharge head 514 is realized by an inkjet head, as illustrated in FIGS. 2A and 2B. Specifically, the droplet discharge apparatus of the present embodiment is an inkjet apparatus.

The droplet discharge head 514 includes a vibrating plate 526 and a nozzle plate 528. Between the vibrating plate 526 and the nozzle plate 528 is a liquid pool 529 where the liquid material 35 supplied from the tank 501 through the tube 510 and a hole 531 is stored at all times.

Further, a plurality of barrier ribs 522 is disposed between the vibrating plate 526 and the nozzle plate 528. The region surrounded by a pair of barrier ribs 522 between the vibrating plate 526 and the nozzle plate 528 defines a cavity (ink chamber) 520. Because the cavity 520 is provided corresponding to the nozzle 518, the cavities 520 are provided as many as the nozzles 518. The liquid material 35 is supplied into the cavity 520 from the liquid pool 529 through an inlet 530 formed between a pair of barrier ribs 522.

Vibrators 524 are provided on the vibrating plate 526, respectively corresponding to the cavities 520. Each vibrator 524 includes a piezo element (piezoelectric element) 524C as the driving element, and a pair of electrodes 524A and 524B formed on the both sides of the piezo element 524C. A drive voltage (signal) is applied (supplied) across the electrodes 524A and 524B to cause vibration in the piezo element 524C and in turn in the vibrating plate 526, thus discharging the liquid material 35 through the corresponding nozzle 518 in the form of droplets 31.

Here, the ejection amount (droplet amount) for each discharge operation of the liquid material 35 through the nozzle 518 can be adjusted by adjusting the drive voltage (for example, the magnitude of the drive voltage).

Note that the nozzle 518 is shaped to discharge the liquid material 35 along the Z-axis direction.

The controller 512 may be adapted to apply drive voltage independently to the vibrators 524. Specifically, the ejection amount for each discharge operation of the liquid material 35 through the nozzle 518 may be controlled for each nozzle 518 according to the signal from the controller 512, specifically the drive voltage. Further, the controller 512 may be adapted to control the nozzles 518 in such a manner that some of the nozzles 518 undergo the discharge operation while the others do not during the apply scan.

Note that each region including the nozzle 518, the corresponding cavity 520, and the corresponding vibrator 524 defines an ejecting section. The ejecting sections are therefore provided as many as the nozzles 518 in the droplet discharge head 514.

The droplet discharge apparatus 500 can be used to supply the liquid material 35 onto the transfer base material 21 in the form of droplets 31, enabling the liquid material 35 to be supplied to a desired position on a bonding face (top surface) 210 of the transfer base material 21. This ensures formation of a liquid coating 30 and thus the bonding film 3 on the transfer base material 21 in a shape corresponding to the film forming region 41. In other words, the liquid coating 30 (bonding film 3) can be reliably formed on the transfer base material 21 in patterns of a predetermined shape.

Note that the droplet discharge head 514 may use an electrostatic actuator as the driving element, instead of the piezo element. Further, the droplet discharge head 514 may be adapted to use a thermoelectric converting element as the driving element, and operated according to the bubble jet scheme to discharge the liquid material 35 by the thermal expansion of material, using the thermoelectric converting element.

According to a bonding method of an embodiment, the bonding film 3 can be formed on the transfer base material 21 in patterns of a predetermined shape using the droplet discharge apparatus described above. Further, the method enables the first base material 22 and the second base material 23 to be bonded to each other after transferring the bonding film 3 formed on the transfer base material 21 to the first base material 22 at a position corresponding to first terminals 221 of the first base material 22, thus electrically connecting the first and second terminals 221 and 231 of the base materials 22 and 23 to each other.

Bonding methods according to embodiments are described below.

Bonding Methods

A bonding method according to an embodiment includes:

a first step of preparing a transfer base material 21 having liquid repellency against a silicone material—and conductive particle 38—containing liquid material 35 at least near a surface, and a first base material 22 having first terminals 221 and a second base material 23 having second terminals 231 that are to be electrically bonded to each other via a bonding film 3;

a second step of applying the liquid material 35 to a liquid repellency-imparted surface 210 of the transfer base material 21 to form a liquid coating 30 in patterns of a predetermined shape, and drying the liquid coating 30 to obtain a bonding film 3 patterned into the predetermined shape;

a third step of imparting energy to the bonding film 3 to develop adhesion near a surface of the bonding film 3, and bonding the transfer base material 21 and the first base material 22 to each other via the bonding film 3, and then separating the transfer base material 21 and the first base material 22 from each other to transfer the bonding film 3 from the transfer base material 21 to the first base material 22;

a fourth step of imparting energy to the bonding film 3 after the transfer to develop adhesion near a surface of the bonding film 3, and bonding the first base material 22 and the second base material 23 to each other via the bonding film 3 to obtain a temporarily bonded structure 1' of the first base material 22 and the second base material 23; and a fifth step of applying pressure to the temporarily bonded structure 1' in a thickness direction of the bonding film. 3 to finalize the bonding between the first base material 22 and the second base material 23 via the bonding film 3 and electrically connect the first terminals 221 and the second terminals 231 via the conductive particles 38 contained in the bonding film 3, so as to obtain a bonded structure 1.

According to this method, the bonding film 3 using a silicone raw material can be formed in a target region of the transfer base material 21 in patterns of a predetermined shape with high deposition accuracy. The bonding film 3 can then be transferred to the first base material 22 to enable the base materials 22 and 23 to be strongly bonded to each other by the adhesion developed near the surface of the bonding film 3.

Further, the bonding film 3 is formed to correspond to the first and second terminals 221 and 231 of the base materials 22 and 23, and the terminals 221 and 231 are electrically connected to each other via the conductive particles 38 contained in the bonding film 3. Thus, when the base materials 22 and 23 include a plurality of terminals 221 and 231, shorting between adjacent terminals 221 or 231 can be reliably prevented.

The following describes a First Embodiment of a bonding method step by step.

First Embodiment

Figure 4A:
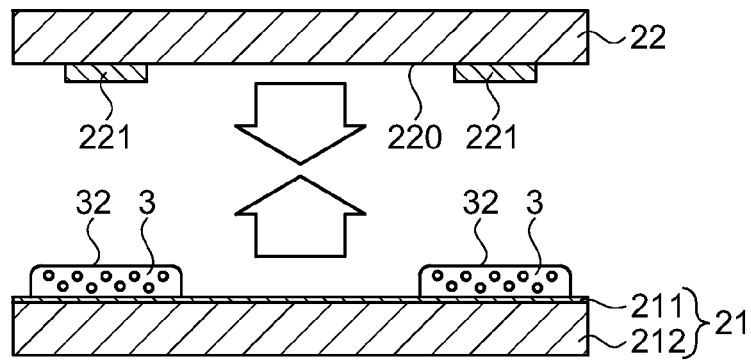
FIGS. 4A to 4D are longitudinal sectional views explaining the First Embodiment of a bonding method.
Figure 4B:
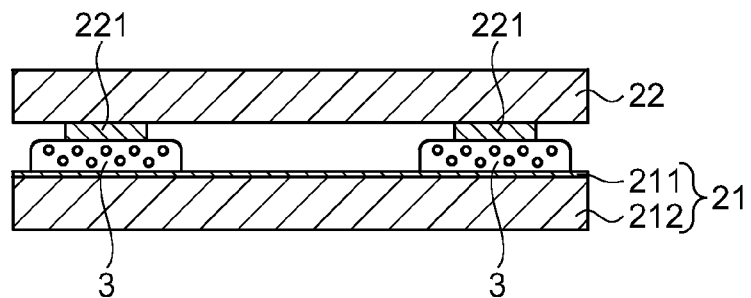
Figure 4C:
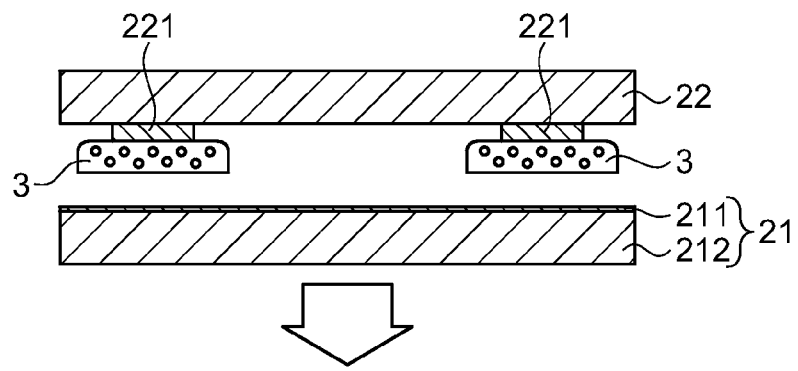
Figure 4D:
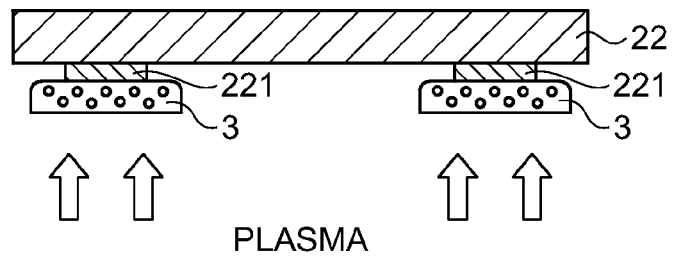
Figure 5A:
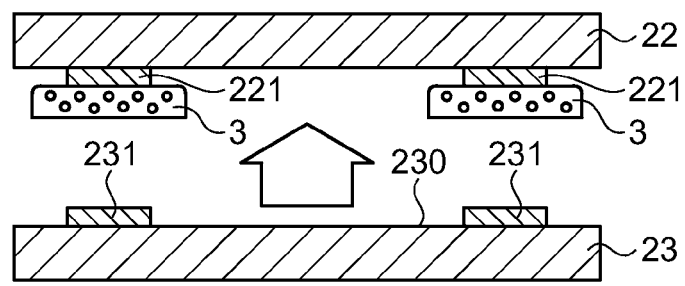
FIGS. 5A to 5C are longitudinal sectional views explaining the First Embodiment of a bonding method.
Figure 5B:
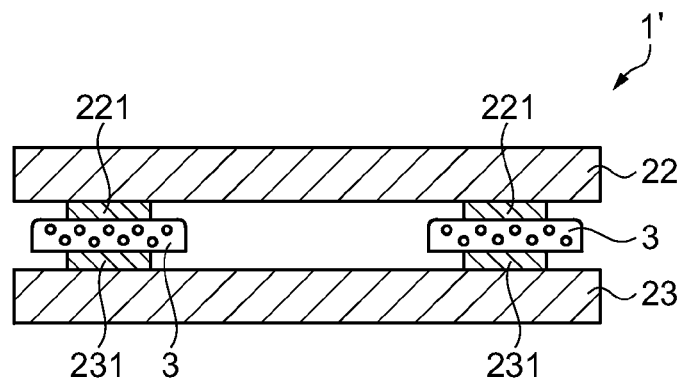

FIGS. 3A to 3D, FIGS. 4A to 4D, and FIGS. 5A to 5C are drawings (longitudinal sections) explaining the First Embodiment of a bonding method. FIG. 6 is a schematic diagram illustrating an atmospheric pressure plasma apparatus used for contacting plasma with the bonding film. In the following, the upper and lower sides of FIGS. 3A to 3D, FIGS. 4A to 4D, FIGS. 5A to 5C, and FIG. 6 will be referred to as "upper" and "lower", respectively.

A bonding method of the present embodiment is a method in which the bonding film 3 formed on the transfer base material 21 in patterns of a predetermined shape is transferred onto the first base material 22 in a manner allowing it to correspond to the first terminals 221 of the first base material 22, and then the first base material 22 and the second base material 23 are bonded to each other via the bonding film 3, and the first terminals 221 of the first base material 22 and the second terminals 231 of the second base material 23 are electrically connected to each other via the bonding film 3 (conductive particles 38).

Step 1: First, the transfer base material 21 that has liquid repellency near a surface, and the first base material 22 having the first terminals 221 and the second base material 23 having the second terminals 231 that are to be electrically bonded to each other via the bonding film 3 are prepared (first step).

Figure 3A:
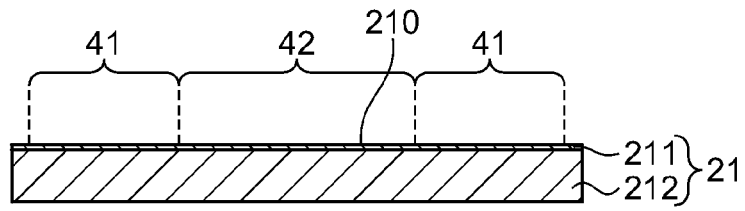
FIGS. 3A to 3D are longitudinal sectional views explaining a First Embodiment of a bonding method of the present invention.

The transfer base material 21 may have any configuration as long as it has liquid repellency near a surface thereof. For example, the transfer base material 21 may be one provided with a liquid repellent film 211 on an upper surface of a base 212, as illustrated in FIG. 3A.

The liquid repellent film 211 may be, for example, a film of a fluorine-based material, or a monomolecular film formed of a coupling agent that contains a fluorine atom.

Specific examples of fluorine-based organic material among the fluorine-based material include polytetrafluoroethylene (PTFE), a tetrafluoroethylene-perfluoroalkyl vinyl ether copolymer (PFA), an ethylene-tetrafluoroethylene copolymer (ETFE), a perfluoroethylene-propene copolymer (FEP), and an ethylene-chlorotrifluoroethylene copolymer (ECTFE). Specific examples of fluorine-based inorganic material include potassium fluorotitanate, potassium fluorosilicate, potassium fluorozirconate, and hydrofluorosilicic acid.

Examples of the coupling agent that contains a fluorine atom include (tridecafluoro-1,1,2,2-tetrahydro-octyl)triethoxysilane, (tridecafluoro-1,1,2,2-tetrahydro-octyl)trimethoxysilane, (tridecafluoro-1,1,2,2-tetrahydro-octyl)trichlorosilane, trifluoropropyltrimethoxysilane, and γ-glycidoxypropyltrimethoxysilane.

The material of the base 212 is not particularly limited, and the following materials can be used, for example. Polyolefins such as polyethylene, polypropylene, ethylene-propylene copolymer, ethylene-acrylic ester copolymer, ethylene-acrylic acid copolymer, polybutene-1, and ethylene-vinyl acetate copolymer (EVA); polyesters such as cyclic polyolefin, modified polyolefin, polyvinyl chloride, polyvinylidene chloride, polystyrene, polyamide, polyimide, polyamideimide, polycarbonate, poly-(4-methylpentene-1), ionomer, acryl-based resin, polymethylmethacrylate(PMMA), acrylonitrile-butadiene-styrene copolymer (ABS resin), acrylonitrile-styrene copolymer (AS resin), butadiene-styrene copolymer, polyoxymethylene, polyvinyl alcohol (PVA), ethylene-vinyl alcohol copolymer (EVOH), polyethylene terephthalate (PET), polyethylene naphthalate, polybutylene terephthalate (PBT), and polycyclohexaneterephthalate (PCT); polyether; polyetherketone (PEK); polyether ether ketone (PEEK); polyetherimide; polyacetal (POM); polyphenylene oxide; modified polyphenylene oxide; polysulfone; polyether sulfone; polyphenylene sulfide; polyallylate; aromatic polyester (liquid crystal polymer); polytetrafluoroethylene; polyvinylidene fluoride; resin-based materials such as fluoro-based resin, various thermoplastic elastomers (for example, styrene-based, polyolefin-based, polyvinyl chloride-based, polyurethane-based, polyester-based, polyamide-based, polybutadiene-based, trans-polyisoprene-based, fluororubber-based, and chlorinated polyethylene-based), epoxy resin, phenol resin, urea resin, melamine resin, aramid-based resin, unsaturated polyester, silicone resin, and polyurethane, or copolymers, blends, and polymer alloys containing these as the main constituent; metals such as Fe, Ni, Co, Cr, Mn, Zn, Pt, Au, Ag, Cu, Pd, Al, W, Ti, V, Mo, Nb, Zr, Pr, Nd, and Sm, or alloys containing these metals; metal-based materials such as carbon steel, stainless steel, indium tin oxide (ITO), and gallium arsenide; silicon-based materials such as monocrystalline silicon, polycrystalline silicon, and amorphous silicon; glass-based materials such as silicate glass (fused quartz), alkali silicate glass, soda-lime glass, potassium-lime glass, lead (alkali) glass, barium glass, and borosilicate glass; ceramic-based materials such as alumina, zirconia, $MgAl_2O_4$, ferrite, silicon nitride, aluminum nitride, boron nitride, titanium nitride, silicon carbide, boron carbide, titanium carbide, and tungsten carbide; carbon-based materials such as graphite; and composite materials combining one or more kinds of these materials.

The first base material 22 may have any configuration as long as it includes the first terminals 221 that correspond to the second terminals 231 of the second base material 23. For example, the first base material 22 may include wires of a predetermined pattern on its base, and the first terminals 221 may be provided at end portions of the wires and exposed on one surface of the first base material 22.

Likewise, the second base material 23 may have any configuration as long as it includes the second terminals 231 that correspond to the first terminals 221 of the first base material 22. For example, the second base material 23 may include wires of a predetermined pattern on its base, and the second terminals 231 may be provided at end portions of the wires and exposed on one surface of the second base material 23.

The bases of the first base material 22 and the second base material 23 may be made of the insulating materials exemplified above as the materials of the base 212 of the transfer base material 21.

The materials used for the bases of the first base material 22 and the second base material 23 may be the same as each other or different from each other.

Preferably, the bases of the first base material 22 and the second base material 23 have substantially the same coefficient of thermal expansion. With substantially the same coefficient of thermal expansion, stress due to thermal expansion does not easily occur at the bonded interface of the first base material 22 and the second base material 23 when these materials are bonded together. This will prevent detachment in the bonded structure 1 ultimately produced.

Note that, as will be described later, the first base material 22 and the second base material 23 can be strongly bonded together with high dimensional accuracy through controlled bonding conditions in a later step (described later), even when the coefficients of thermal expansion are different between the bases of these base materials.

Preferably, the bases of the base materials 22 and 23 have different rigidities. This enables the base materials 22 and 23 to be bonded even more strongly.

The bases of the base materials 22 and 23 can have any shape, as long as they have a surface that can support the bonding film 3. For example, the base materials 22 and 23 may be in the form of plates (layers), lumps (blocks), or rods.

In the present embodiment, as illustrated in FIGS. 3A to 3D to FIGS. 5A to 5C, the bases of the base materials 22 and 23 are plate-like in shape. This makes the bases of the base materials 22 and 23 easily bendable, and the base materials 22 and 23 sufficiently undergo deformation in conformity with each other when stacked together. This improves the adhesion between the base materials 22 and 23 stacked together, and the bond strength of the bonded structure 1 produced.

Further, the bending of the bases of the base materials 22 and 23 is expected to relieve, to some extent, the stress that generates at the bonded interface.

In this case, the average thickness of each base of the base materials 22 and 23 is not particularly limited, and is preferably about 0.01 to 10 mm, more preferably about 0.1 to 3 mm.

The first terminals 221 and the second terminals 231 (provided two each for the first and second base materials 22 and 23, respectively, in this embodiment) are provided to project out of one of the surfaces of the base materials 22 and 23 so that the first terminals 221 and the second terminals 231 correspond to each other (overlap each other) when the first base material 22 and the second base material 23 are mated to each other via the bonding film 3, as will be described later.

The materials of the wires and the terminals 221 and 231 are not particularly limited, as long as they are conductive. Examples of such conductive materials include: metal materials such as copper, aluminum, nickel, cobalt, platinum, gold, silver, molybdenum, tantalum, or alloys of these metals; carbon-based materials such as carbon black, carbon nanotubes, and fullerenes; electron conducting polymeric materials such as polyacetylene, polypyrrole, polythiophene, polyaniline, poly(p-phenylene), poly(p-phenylene vinylene), polyfluorene, polycarbazole, and derivatives thereof; ion conductive polymeric materials that include ionic substance dispersed in a matrix resin such as polyvinyl alcohol, polycarbonate, polyethyleneoxide, polyvinyl butyral, polyvinyl carbazole, and vinyl acetate; and conductive oxide materials such as indium tin oxide (ITO), fluorine-doped tin oxide (FTO), tin oxide ($SnO_2$), and indium oxide (TO). These may be used in combinations of one or more.

Note that the materials of the first terminals 221 and the second terminals 231 may be the same as each other or different from each other.

If desired, the surfaces of the first and second terminals 221 and 231 may be subjected to a surface treatment to improve adhesion for the bonding film 3. The surface treatment cleans and activates the surfaces of the first and second terminals 221 and 231, making it easier for the bonding film 3 to chemically act on the first and second terminals 221 and 231. As a result, the bond strength between the first and second terminals 221 and 231 and the bonding film 3 can be improved when the bonding film 3 is bonded to the first and second terminals 221 and 231 in a subsequent step (described later).

The surface treatment includes, but is not particularly limited to, for example, physical surface treatment such as sputtering and a blast treatment; plasma treatment using, for example, oxygen plasma or nitrogen plasma; chemical surface treatment such as corona discharge, etching, electron ray irradiation, ultraviolet ray irradiation, and ozone exposure; and combinations of these. When the surface treatment is plasma treatment or ultraviolet ray irradiation in particular, the first and second terminals 221 and 231 can be cleaned and activated more efficiently. As a result, the bond strength between the first and second terminals 221 and 231 and the bonding film 3 can be further improved.

Note that the surface treatment is optional, and may be omitted when high bond strength is not desired.

Step 2: Next, the liquid material 35 containing a silicone material and the conductive particles 38 is applied to the surface of the transfer base material 21 on the side of the liquid repellent film 211, so as to form the liquid coating 30 in patterns of a predetermined shape, and the liquid coating 30 is dried to obtain the bonding film 3 patterned into the predetermined shape (second step).

This step is described below in detail.

2-1: The liquid material 35 containing a silicone material and the conductive particles 38 is supplied in droplets 31 to the bonding face 210 of the transfer base material 21 on the side of the liquid repellent film 211, using, for example, the droplet discharge method with the droplet discharge apparatus 500.

Figure 3B:
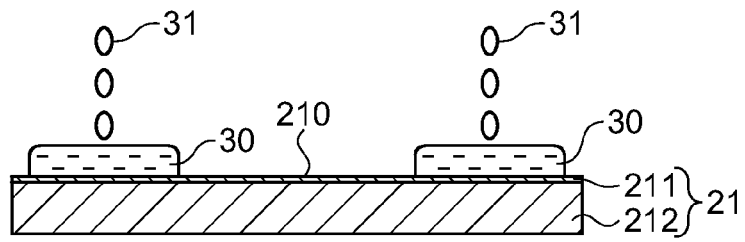

In this way, the droplets 31 are selectively supplied to the film forming region 41 of the bonding face 210 illustrated in FIG. 3A, avoiding a film devoid region 42 of the bonding face 210. As a result, as illustrated in FIG. 3B, the liquid coating 30 is formed on the transfer base material 21 in patterns of the shape of the film forming region 41, i.e., in patterns of a predetermined shape.

As used herein, the "predetermined shape" refers to the shape that corresponds in shape to the position where the bonding by the bonding film 3 is desired, specifically the shape of the bonding film 3 corresponding to the shape of the first terminal after the transfer to the first base material 23 in the next step 3. In the present embodiment, it is the shape corresponding to the film forming region 41 of the transfer base material 21.

In the present embodiment, the liquid material 35 is selectively applied (supplied) to the film forming region 41 of the bonding face 220 using the droplet discharge method of supplying the liquid material 35 in droplets 31, using the droplet discharge apparatus 500.

By supplying the liquid material 35 with the position selectivity using the droplet discharge method, the liquid material 35 will not be wasted. Further, the number of steps to form the bonding film 3, and the time and cost of manufacturing can be reduced compared with, for example, the patterning of the film with the use of a resist layer formed as a mask on the substrate.

Further, in the present embodiment, the droplet discharge method is an inkjet method that uses the droplet discharge head 514 as the inkjet head. The inkjet method enables the liquid material 35 to be supplied to a target region (position) in the form of droplets 31 with excellent positional accuracy. Further, because the size (volume) of the droplets 31 can be adjusted with relative ease by appropriately setting parameters such as the vibration frequency of the piezo element 524C and the viscosity of the liquid material 35, the liquid coating 30 can be reliably formed in a shape corresponding to the film forming region 41 by reducing the size of the droplets 31, even when the film forming region 41 has microscopic dimensions.

The viscosity (25° C.) of the liquid material 35 is preferably in the range of generally about 0.5 to 200 mPa·s, more preferably about 3 to 20 mPa·s. With the viscosity of the liquid material 35 falling in these ranges, the droplets can be discharged more stably, and the droplets 31 can be discharged in shapes with which the film forming region 41 of even microscopic dimensions can be delineated. Further, with the foregoing viscosity ranges, the liquid material 35 contains the silicone material and the conductive particles 38 in an amount sufficient to form the bonding film 3 when the liquid coating 30 formed from the liquid material 35 is dried in the next step 2-2.

Further, the amount of each droplet 31 (one droplet of the liquid material 35) can be set to, on average, about 0.1 to 40 pL, practically about 1 to 30 pL, provided that the viscosity of the liquid material 35 is in the foregoing ranges. In this way, the dot diameter of the droplets 31 supplied onto the bonding face 220 will be small, ensuring formation of the bonding film 3 of even microscopic dimensions.

Further, by appropriately setting the amount of the droplets 31 supplied to the film forming region 41 of the bonding face 220, the thickness of the bonding film 3 can be controlled relatively easily.

In an embodiment, liquid repellency is imparted to the bonding face 210 to which the liquid material 35 is applied (supplied) in the form of droplets 31. In this way, the wettability spreading of the droplets 31 on the bonding face 210 can be appropriately suppressed or prevented upon application of the droplets 31 to the bonding face 210. Accordingly, the liquid coating 30 formed on the bonding face 210 retains the shape of the film forming region 41 with excellent patterning accuracy.

The wettability of the liquid coating 30 with respect to the bonding face 210 can be represented by, for example, the contact angle of the liquid coating 30 with respect to the bonding face 210. The contact angle is preferably about 80 to 110°, more preferably about 85 to 100°. The foregoing effects can be exhibited more prominently by appropriately selecting the type of the liquid material 35 and the liquid repellent film 211 so as to satisfy such relationships.

The liquid material 35 discharged in droplets 31 contains a silicone material and the conductive particles 38. However, when the mixture of the silicone material and the conductive particles 38 is available in liquid form and has a desired viscosity range alone, the mixture can be used directly as the liquid material 35. Further, when the silicone material is available in solid or high-viscosity liquid form alone, a dispersion of the conductive particles 38 in a solution or dispersion of the silicone material can be used as the liquid material 35.

Examples of the solvent or dispersion medium used to dissolve or disperse the silicone material include inorganic solvents such as ammonia, water, hydrogen peroxide, carbon tetrachloride, and ethylene carbonate, and various organic solvents including: ketone-based solvents such as methyl ethyl ketone (MEK) and acetone; alcohol-based solvents such as methanol, ethanol, and isobutanol; ether-based solvents such as diethylether and diisopropylether; cellosolve-based solvents such as methyl cellosolve; aliphatic hydrocarbon-based solvents such as hexane and pentane; aromatic hydrocarbon-based solvents such as toluene, xylene, and benzene; aromatic heterocyclic compound-based solvents such as pyridine, pyrazine, and furan; amide-based solvents such as N,N-dimethylformamide (DMF); halogen compound-based solvents such as dichloromethane and chloroform; ester-based solvents such as ethyl acetate and methyl acetate; sulfur compound-based solvents such as dimethyl sulfoxide (DMSO) and sulfolane; nitrile-based solvents such as acetonitrile, propionitrile, and acrylonitrile; and organic acid-based solvents such as formic acid and trifluoroacetic acid. Mixed solvents containing these can also be used.

The silicone material is a material contained in the liquid material 35, and, together with the conductive particles 38, makes up the main material of the bonding film 3 formed by drying the liquid material 35 in the next step 2-2. Because the bonding film. 3 contains the silicone material, the bonding film 3 can exhibit adhesion on the surface upon imparting energy in the next steps 3 and 4.

The "silicone material" is a compound having a polyorganosiloxane backbone, in which the main backbone (main chain) is generally of primarily organosiloxane repeating units, and includes at least one silanol group. The silicone material may be of a branched structure including a branch in the main chain, or may be in cyclic form including a cyclic main chain, or may have a straight-chain structure in which the ends of the main chain are not joined.

For example, in a compound including the polyorganosiloxane backbone, the organosiloxane unit at the terminal portion has a structure unit represented by general formula (1) below. At the linking portion and the branched portion, the organosiloxane unit has structure units represented by general formulae (2) and (3) below, respectively.

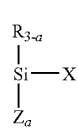
(1)

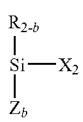
(2)

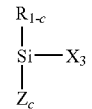
(3)

In the formulae, each R independently represents a substituted or unsubstituted hydrocarbon group, each Z independently represents a hydroxyl group or a hydrolyzable group, X represents a siloxane residue, "a" represents an integer of 1 to 3, "b" represents 0 or an integer of 1 to 2, and "c" represents 0 or 1.

The siloxane residue is a substituent forming a siloxane bond with the silicon atom of the adjacent structure unit via an oxygen atom, specifically an —O—(Si) structure (where Si is the silicon atom of the adjacent structure unit).

In such a silicone material, the polyorganosiloxane backbone is preferably branched; specifically, it preferably has the structure unit represented by general formula (1), (2), or (3). A compound having such a branched polyorganosiloxane backbone (hereinafter, also referred to as "branched compound") is a compound whose main backbone (main chain) is of primarily organosiloxane repeating units, and in which the organosiloxane repeating units branch out in a middle of the main chain, and in which the ends of the main chains are not joined.

With the branched compound, the branch chains of the compound in the liquid material 35 tangle together to form the bonding film 3 in the next step 2-2, and thus the resulting bonding film 3 has a particularly superior film strength.

Note that in general formulae (1) to (3), examples of the R group (substituted or unsubstituted hydrocarbon group) include: alkyl groups such as a methyl group, an ethyl group, and a propyl group; cycloalkyl groups such as a cyclopentyl group and a cyclohexyl group; aryl groups such as a phenyl group, a tolyl group, and a biphenylyl group; and aralkyl groups such as a benzyl group and a phenylethyl group. Some of or all of the hydrogen atoms attached to the carbon atoms of these groups may be substituted with, for example, (I) halogen atoms such as a fluorine atom, a chlorine atom, and a bromine atom, (II) epoxy groups such as a glycidoxy group, (III) (meth)acryloyl groups such as a methacryl group, or (IV) anionic groups such as a carboxyl group and a sulfonyl group.

When the Z group is a hydrolyzable group, examples of the hydrolyzable group include: alkoxy groups such as a methoxy group, an ethoxy group, a propoxy group, and a butoxy group; ketoxime groups such as a dimethyl ketoxime group and a methyl ethyl ketoxime group; acyloxy groups such as an acetoxy group; and alkenyloxy groups such as an isopropenyloxy group and an isobutenyloxy group.

The branched compound has a molecular weight of preferably about $1\times10^4$ to $1\times10^6$, more preferably about $1\times10^5$ to $1\times10^6$. With the molecular weight set in these ranges, the viscosity of the liquid material 35 can be set in the foregoing ranges with relative ease.

It is preferable that the branched compound include a plurality of silanol groups (hydroxyl groups) within the compound. Specifically, in the structure units represented by general formulae (1) to (3), it is preferable to include a plurality of Z groups, and that these Z groups be hydroxyl groups. This ensures the bonding between the hydroxyl group of the branched compound and the hydroxyl group of the polyester resin, thus ensuring the synthesis of the polyester-modified silicone material obtained by the dehydrocondensation reaction between the branched compound and the polyester resin (described later). Further, in obtaining the bonding film 3 by drying the liquid coating 30 in the next step 2-2, the hydroxyl groups contained in the residual silanol groups of the silicone material (or more specifically the branched compound) bind together, improving the film strength of the resulting bonding film 3.

The hydrocarbon group joined to the silicon atom of the silanol group is preferably a phenyl group. Specifically, the R group in the structure units of general formulae (1) to (3) in which the Z group is a hydroxyl group is preferably a phenyl group. This further improves the reactivity of the silanol group, and thus facilitates the bonding between the hydroxyl groups of the adjacent branched compounds. Further, by substituting at least one of the methyl groups of the branched compound with a phenyl group to include the phenyl group in the resulting bonding film 3, the film strength of the bonding film 3 can be further improved.

The hydrocarbon group joined to the silicon atom without a silanol group is preferably a methyl group. Specifically, the R group in the structure units of general formulae (1) to (3) in which the Z group is not present is preferably a methyl group. A compound in which the R group in the structure units of general formulae (1) to (3) in which the Z group is not present is a methyl group is available relatively easily and inexpensively. Further, in later steps 3 and 4, the methyl group can be easily cut by imparting energy to the bonding film 3, and adhesion can be reliably developed to the bonding film 3. Such compounds are therefore suitable as the branched compound (silicone material).

Taking these into consideration, a compound represented by general formula (4) below can be suitably used as the branched compound, for example.

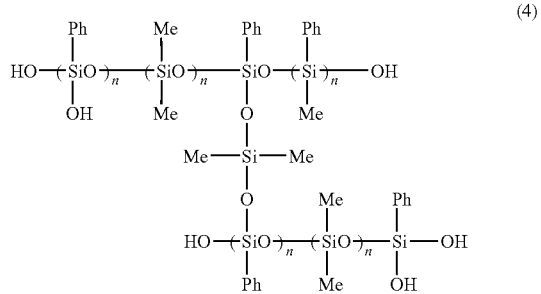

(4)

In the formula, n independently represents 0 or an integer of 1 or more.

The branched compound has a relatively high flexibility. Thus, in obtaining the bonded structure 1 by bonding the first base material 22 and the second base material 23 via the bonding film 3 in a later step 5, the stress due to the thermal expansion between the base materials 22 and 23 can be reliably relieved even when, for example, different materials are used for the first base material 22 and the second base material 23. This ensures that detachment does not occur in the bonded structure 1 produced.

The silicone material is preferably a polyester-modified silicone material.

As used herein, the "polyester-modified silicone material" is the material obtained by the dehydrocondensation reaction between silicone material and polyester resin.

The "polyester resin" is one obtained by the esterification reaction between saturated polybasic acid and polyalcohol, and those including at least two hydroxyl groups per molecule are suitably used.

The condensation reaction between the polyester resin and the silicone material causes a dehydrocondensation reaction between the hydroxyl group of the polyester resin and the silanol group (hydroxyl group) of the silicone material to give the polyester-modified silicone material in which the polyester resin is joined to the silicone material.

The saturated polybasic acid is not particularly limited. Examples include isophthalic acid, terephthalic acid, anhydrous phthalic acid, and adipic acid, which may be used in combinations of one or more.

Examples of polyalcohol include ethylene glycol, diethylene glycol, propylene glycol, glycerine, and trimethylolpropane, which may be used in combinations of one or more.

The contents of the saturated polybasic acid and the polyalcohol in the esterification reaction are set so that the hydroxyl groups of the polyalcohol exceed the carboxyl groups of the saturated polybasic acid in number. In this way, the synthesized polyester resin comes to include at least two hydroxyl groups per molecule.

The polyester resin preferably includes a phenylene group within the molecule. When the bonding film 3 is formed with the polyester-modified silicone material that contains such polyester resin, the resulting bonding film 3 exhibits particularly superior film strength because of the phenylene group contained in the polyester resin.

Taking these into consideration, a compound represented by general formula (5) below can be suitably used as the polyester resin, for example.

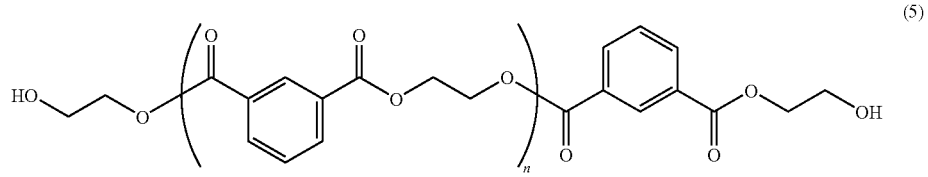

(5)

In the formula, n represents 0 or an integer of 1 or more.

The polyester-modified silicone material including such polyester resin generally exists in a state in which the polyester resin is exposed on the polyorganosiloxane backbone of a helical structure. Thus, in obtaining the bonding film 3 by drying the liquid coating 30 in the next step 2-2, the polyester resin in the polyester-modified silicone material has a greater chance to contact with each other between adjacent molecules. As a result, the polyester resins tangle together in the polyester-modified silicone material, and the hydroxyl groups of the polyester resin are chemically bound to each other by dehydrocondensation. In this way, the film strength of the resulting bonding film 3 can be reliably improved.

In the bonding of the first base material 22 and the second base material 23 via the bonding film 3 in a later step 4, the ketone group of the polyester resin binds to the hydroxyl group of the first and second terminals 221 and 231 by hydrogen bonding at the interface between the bonding film 3 and the first terminals 221 of the first base material 22, and between the bonding film 3 and the second terminals 231 of the second base material 23. This enables the bonding film 3 to be strongly bonded to the first and second terminals 221 and 231.

The conductive particles 38 are contained in the liquid material 35, and, together with the silicone material, make up the main material of the bonding film 3 formed by drying the liquid material 35 in the next step 2-2. Because the bonding film 3 contains the conductive particles 38, applying pressure to the first base material 22 and the second base material 23 in a thickness direction of the bonding film 3 in a later step 5 electrically connects the first terminals 221 and the second terminals 231 via the conductive particles 38 contained in the bonding film 3.

The conductive particles 38 are particles with a conductive material residing at least near the surface. Specifically, the conductive particles 38 may be, for example, (I) particles entirely made of conductive material, or (II) particles including non-conductive base particles, and a conductive film covering the surface of the base particles. Of these, the latter is more preferable because it makes it easier to adjust various parameters of the conductive particles 38, including shape, size (for example, average particle diameter), and properties (for example, conductivity, density).

The material of the base particles is not particularly limited, and various metal materials, various ceramic materials, and various resin materials can be used, for example. The use of resin material is particularly preferable. Generally, the resin material has a specific gravity close to that of the silicone material. Accordingly, the conductive particles 38 do not easily settle out or float in the liquid material 35, and thus exist in the state of being uniformly dispersed in the liquid material 35. It is therefore ensured that the first and second terminals 221 and 231 are electrically connected to each other via the conductive particles 38 contained in the bonding film 3 upon pressure application to the first base material 22 and the second base material 23 in a thickness direction of the bonding film 3 in a later step 5.

Further, because the resin material generally has high flexibility, the base particles made of resin material, and thus the conductive particles 38 including such base particles readily deform into a flat shape under exerted compression force. This increases the contact area of the conductive particles 38 with respect to the first terminals 221 and the second terminals 231 upon pressure application to the first base material 22 and the second base material 23 in a thickness direction of the bonding film 3 in a later step 5. As a result, the conductivity between the first terminals 221 and the second terminals 231 via the bonding film 3 can be increased in the bonded structure 1 produced.

Further, because the conductive particles 38 are flexible, any variation in the particle diameter of the conductive particles 38 arising from nonuniform particle diameters can be complemented in the thickness direction of the bonding film 3 by the deformation of the larger particles. Further, the contact between the conductive particles 38 and the first and second terminals 221 and 231 can be ensured even when there are surface irregularities on the first and second terminals 221 and 231, because the conductive particles 38 undergo deformation against the raised portions of the irregularities.

The conductive film of the conductive particles 38 may be made of the same conductive materials exemplified for the first and second terminals 221 and 231. Conductive materials of primarily Ni, Cu, or Au are particularly preferable. Because such conductive materials are highly conductive, the conductivity of the conductive particles 38 can be increased to improve conductivity between the first and second terminals 221 and 231.

The conductive particles 38 may be in the form of, for example, Ni particles, Au-plated Ni particles, Au-plated Cu particles, or Au-plated resin particles.

The shape of the conductive particles 38 is not particularly limited, and may be, for example, spherical, flat, needle-like, or irregular.

The average particle diameter of the conductive particles 38 is not particularly limited, and is preferably about 0.3 to 100 $\mu$m, more preferably about 1 to 50 $\mu$m. An average particle diameter of the conductive particles 38 below these lower limits encourages agglomeration of the conductive particles 38 in the liquid material 35, which may result in difficulties in uniformly dispersing the conductive particles 38. On the other hand, an average particle diameter of the conductive particles 38 exceeding the foregoing upper limits increases the chance of contact between the conductive particles 38 or between the conductive particles 38 and the first and second terminals 221 and 231 in the bonding film 3 without the pressure applied to the first base material 22 and the second base material 23 in a thickness direction of the bonding film 3, with the result that the bonding film 3 may accidentally develop conductivity.

Figure 3C:
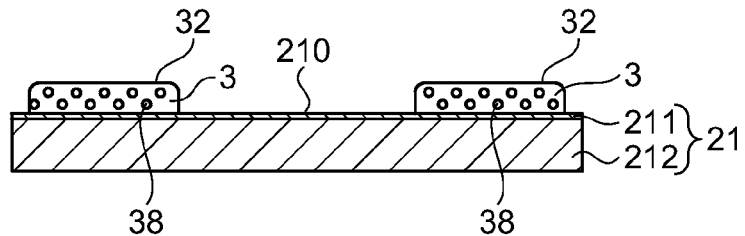

2-2: Then, the liquid material 35 supplied onto the transfer base material 21, or specifically the liquid coating 30 selectively formed in the film forming region 41 on the bonding face 210 is dried. As a result, the bonding film 3 is formed in patterns corresponding to the shape of the film forming region 41 (predetermined shape), as illustrated in FIG. 3C.

The drying temperature of the liquid coating 30 is preferably 25° C. or more, more preferably about 25 to 100° C.

The drying time is preferably about 0.5 to 48 hours, more preferably about 15 to 30 hours.

By drying the liquid coating 30 under these conditions, the bonding film 3 desirably developing adhesion can be reliably formed by imparting energy in the next steps 3 and 4. Further, when the silicone material includes a silanol group as described in step 2-1, or when a polyester-modified silicone material is used, the silanol groups of these materials can be reliably bonded to each other, and the film strength of the resulting bonding film 3 can be improved.

The pressure of the drying atmosphere may be atmospheric pressure, but is preferably reduced pressure. Specifically, the reduced pressure is preferably about $133.3 \times 10^{-5}$ to 1,333 Pa ($1 \times 10^{-5}$ to 10 Torr), and more preferably about $133.3 \times 10^{-4}$ to 133.3 Pa ($1 \times 10^{-4}$ to 1 Torr). This densifies the bonding film 3, and thus further improves the film strength of the bonding film 3.

As described above, by appropriately setting the conditions of forming the bonding film 3, the film strength or other properties of the resulting bonding film 3 can be altered as desired.

The average thickness of the bonding film 3 is preferably from about 0.5 to 500 $\mu$m, more preferably about 1 to 200 $\mu$m. By appropriately setting the supply amount of the liquid material 35 to confine the average thickness of the bonding film 3 in the foregoing ranges, there will be no significant decrease in the dimensional accuracy of the bonded structure 1 of the first base material 22 and the second base material 23, and these materials can be bonded to each other even more strongly.

In other words, when the average thickness of the bonding film 3 is below the foregoing lower limit, sufficient bond strength may not be obtained. On the other hand, an average thickness of the bonding film 3 above the foregoing upper limit may lead to a significant decrease in the dimensional accuracy of the bonded structure 1.

Further, with the average thickness of the bonding film 3 falling in the foregoing ranges, the conductive particles 38 in the bonding film 3 reliably make contact with one another in the thickness direction of the bonding film 3 upon application of pressure to the temporarily bonded structure 1' in this direction in a later step 5, making it possible to electrically connect the first terminals 221 and the second terminals 231 to each other via the bonding film 3 (conductive particles 38).

Further, with the average thickness of the bonding film 3 falling in the foregoing ranges, the bonding film 3 becomes elastic to some extent. Thus, when bonding the first base material 22 and the second base material 23 in a later step 4, any particles or objects that may be present on the second terminals 231 brought into contact with the bonding film 3 can be entrapped by the bonding film 3 bonded to the second terminals 231. Thus, the bond strength between the bonding film 3 and the bonding face 230 will not be lowered by the presence of such particles, or detachment at the interface can be appropriately suppressed or prevented.

Step 3: Next, energy is imparted to the bonding film 3 to develop adhesion near the surface of the bonding film 3, and the transfer base material 21 is bonded to the first base material 22 via the bonding film 3, and then separated from the first base material 22 to transfer the bonding film 3 from the transfer base material 21 to the first base material 22 (third step).

Note that because the bonding film 3 has been formed on the transfer base material 21 in patterns of a predetermined shape corresponding to the shape of the first terminals 221 of the first base material 22, the bonding film 3 adheres to the first terminals 221 upon transfer from the transfer base material 21 to the first base material 22 in this step 3, as illustrated in FIG. 4C.

The step is described below in detail.

3-1: First, energy is imparted to a surface 32 of the bonding film 3 formed in the film forming region 41 on the bonding face 210. The energy imparted to the bonding film 3 cuts some of the molecular bonds near the surface 32 of the bonding film 3, and thereby activates the surface 32. As a result, adhesion is developed near the surface 32 with respect to the first base material 22.

The bonding film 3 in this state is strongly bondable to the first terminals 221 of the first base material 22 by chemical bonding.

As used herein, the "activated" state of the surface 32 refers to a state in which some of the molecular bonds on the surface 32 of the bonding film 3, specifically, for example, the methyl group of the polydimethylsiloxane backbone are cut to produce unterminated bonds (hereinafter, also referred to as "dangling bonds") in the bonding film. 3, or a state in which the dangling bond is terminated by the hydroxyl group (OH group). These states, including a coexisting state of these, are collectively referred to as the "activated" state of the bonding film 3.

Any method can be used to impart energy to the bonding film 3. Examples include irradiating the bonding film 3 with energy rays, heating the bonding film 3, applying a compression force (physical energy) to the bonding film 3, exposing the bonding film 3 to plasma (imparting plasma energy), and exposing the bonding film 3 to ozone gas (imparting chemical energy). In this way, the surface of the bonding film 3 can be efficiently activated.

Figure 3D:
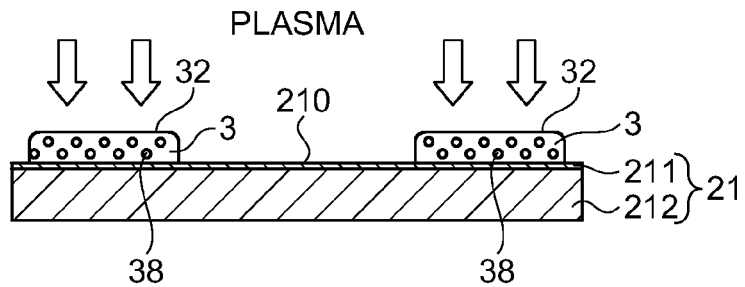

Among these methods, it is particularly preferable to impart energy to the bonding film 3 by exposing the bonding film 3 to plasma, as illustrated in FIG. 3D.

Before explaining the reason the plasma exposure of the bonding film 3 is preferable as the method of imparting energy to the bonding film 3, problems associated with using an ultraviolet ray as the energy ray and irradiating the bonding film 3 with the ultraviolet ray are addressed.

A: Activation of the surface 32 of the bonding film 3 takes a long time (for example, 1 to several tens of minutes). Further, when the duration of the ultraviolet ray irradiation is brief, the bonding of the first base material 22 and the second base material 23 takes a long time (at least several ten minutes) in the bonding step. That is, it takes a long time to obtain the bonded structure 1.

B: When the ultraviolet ray is used, the ultraviolet ray has the likelihood of passing through the bonding film 3 in a thickness direction. Thus, depending on the material (for example, resin material) of the base material (the transfer base material 21 in this embodiment), the interface (contacting face) between the base material and the bonding film 3 degrades, and the bonding film 3 easily detaches from the base material.

Further, the ultraviolet ray acts on the entire portion of the bonding film 3 as it passes through the bonding film 3 in a thickness direction, cutting and removing, for example, the methyl group of the polydimethylsiloxane backbone throughout the bonding film 3. Specifically, the amounts of organic components in the bonding film 3 become notably low, and the film becomes more inorganic. As a result, the flexibility of the bonding film 3 attributed to the presence of the organic components is reduced over all, and the resulting bonded structure 1 becomes susceptible to interlayer detachment in the bonding film 3.

C: When the bonded structure 1 is recycled or reused by detaching and separating the first base material 22 from the second base material 23, the base materials 22 and 23 are detached by imparting detachment energy to the bonded structure 1. Here, for example, the residual methyl group (organic component) in the bonding film 3 is cut and removed from the polydimethylsiloxane backbone, and the organic component so cut becomes a gas. The gas (gaseous organic component) then dissociates the bonding film 3 into pieces.

However, in the case of ultraviolet ray irradiation, because the bonding film 3 becomes more inorganic throughout in the manner described above, only a fraction of the organic component turns into a gas in response to the imparted detachment energy, and the bonding film 3 is hardly dissociated.

In contrast, in the plasma exposure of the surface 32 of the bonding film 3, some of the molecular bonds in the material forming the bonding film 3, for example, the methyl group of the polydimethylsiloxane backbone is selectively cut near the surface 32 of the bonding film 3.

Note that the plasma cutting of the molecular bond occurs in an extremely short time period because it is induced not only by the chemical action based on the plasma charge, but by the physical action based on the Penning effect of the plasma. Thus, the bonding film 3 can be activated in an extremely short time period (for example, on the order of several seconds), and as a result the bonded structure 1 can be produced in a short amount of time.

The plasma selectively acts on the surface 32 of the bonding film 3, and hardly affects inside the bonding film 3. Thus, the cutting of the molecular bond selectively occurs near the surface 32 of the bonding film 3. In other words, the bonding film 3 is selectively activated near the surface 32. Accordingly, the problems associated with the activation of the bonding film 3 by the ultraviolet ray (problems B and C above) are unlikely to occur.

In this manner, by using plasma for the activation of the bonding film 3, interlayer detachment of the bonding film 3 in the bonded structure 1 hardly occurs, and the first base material 22 can be reliably detached from the second base material 23 when such a procedure is desired.

In the ultraviolet ray activation of the bonding film 3, the extent to which the bonding film 3 is activated is highly dependent on the intensity of the ultraviolet ray irradiation. Thus, the ultraviolet ray irradiation needs to be performed under strictly controlled conditions, in order to activate the bonding film 3 to such an extent suitable for the bonding of the first base material 22 and the second base material 23. Without such strict control, there will be variation in the bond strength between the first base material 22 and the second base material 23 in the resulting bonded structure 1.

In contrast, in the plasma activation of the bonding film 3, the activation of the bonding film 3 proceeds more gradually in a manner that depends on the density of the contacted plasma. Accordingly, the conditions of plasma generation do not require strict control for the activation of the bonding film 3 to an extent suitable for the bonding of the first base material 22 and the second base material 23. In other words, the plasma activation of the bonding film 3 is more tolerant in terms of manufacturing conditions of the bonded structure 1. Further, variation in the bond strength between the first base material 22 and the second base material 23 in the bonded structure 1 hardly occurs even without any strict control.

The ultraviolet ray activation of the bonding film 3 is also problematic in that the bonding film 3 itself shrinks (especially, in thickness) as a result of activation, or specifically as a result of the elimination of the organics in the bonding film 3. When the bonding film 3 shrinks, high-strength bonding of the first base material 22 and the second base material 23 becomes difficult.

In contrast, the bonding film 3 rarely shrinks, if any, with the plasma activation of the bonding film 3 that selectively activates near the surface of the bonding film 3 in the manner described above. Thus, the first base material 22 and the second base material 23 can be bonded to each other with high bond strength even when the bonding film 3 is relatively thin. Further, in this case, the bonded structure 1 can have high dimensional accuracy, and the thickness of the bonded structure 1 can be reduced.

As described above, the plasma activation of the bonding film 3 has many advantages over the ultraviolet ray activation of the bonding film 3.

The plasma may be contacted with the bonding film 3 under reduced pressure, or preferably under atmospheric pressure. Specifically, it is preferable that the bonding film 3 be treated with an atmospheric pressure plasma. In the atmospheric pressure plasma treatment, because the environment surrounding the bonding film 3 is not reduced pressure, for example, the methyl group of the polydimethylsiloxane backbone of the polyester-modified silicone material will not be unnecessarily cut when cutting and removing the methyl group (during the activation of the bonding film 3) by the action of plasma.

The plasma treatment under atmospheric pressure can be performed using, for example, the atmospheric pressure plasma treatment apparatus illustrated in FIG. 6.

FIG. 6 is a schematic diagram showing a structure of the atmospheric pressure plasma apparatus.

An atmospheric pressure plasma apparatus 1000 illustrated in FIG. 6 includes a carrier unit 1002 provided for the transport of the transfer base material 21 on which the bonding film 3 has been formed (hereinafter, simply referred to as "worked substrate W"), and a head 1010 disposed above the carrier unit 1002.

The atmospheric pressure plasma apparatus 1000 includes a plasma generating region p, where a plasma is generated, formed between an apply electrode 1015 and a counter electrode 1019 of the head 1010.

The structure of each component is described below.

The carrier unit 1002 includes a movable stage 1020 that can carry the worked substrate W. The movable stage 1020 is made movable along the direction of x axis by the activation of a moving section (not shown) provided for the carrier unit 1002.

The movable stage 1020 is made of metal materials, such as stainless steel and aluminum.

The head 1010 includes a head main body 1101, in addition to the apply electrode 1015 and the counter electrode 1019.

In the head 1010, a gas supply channel 1018 is provided through which a processing plasma gas G is supplied to a gap 1102 between an upper surface of the movable stage 1020 (carrier unit 1002) and a lower face 1103 of the head 1010.

The gas supply channel 1018 has an opening 1181 formed at the lower face 1103 of the head 1010. As illustrated in FIG. 6, there is a step difference on the left of the lower face 1103. Accordingly, a gap 1104 between the left-hand side of the head main body 1101 and the movable stage 1020 is smaller (narrower) than the gap 1102. This suppresses or prevents the processing plasma gas G from entering the gap 1104, producing a preferential flow of the processing plasma gas G in the positive direction along the x axis.

The head main body 1101 is made of dielectric materials, such as alumina and quartz.

In the head main body 1101, the apply electrode 1015 and the counter electrode 1019 are disposed face to face with the gas supply channel 1018 in between, so as to form a pair of parallel-plate electrodes. The apply electrode 1015 is electrically connected to a high-frequency power supply 1017. The counter electrode 1019 is grounded.

The apply electrode 1015 and the counter electrode 1019 are made of metal materials, such as stainless steel and aluminum.

In the plasma treatment of the worked substrate W with the atmospheric pressure plasma apparatus 1000, voltage is applied between the apply electrode 1015 and the counter electrode 1019 to generate an electric field E. In this state, the processing gas G is dispersed into the gas supply channel 1018. The processing gas G dispersed into the gas supply channel 1018 discharges under the influence of the electric field E, and a plasma gas is produced. The resulting processing plasma gas G is then supplied into the gap 1102 through the opening 1181 on the lower face 1103. As a result, the processing plasma gas G contacts the surface 32 of the bonding film 3 formed on the worked substrate W, thus completing the plasma treatment.

With the atmospheric pressure plasma apparatus 1000, the plasma is able to easily and reliably contact the bonding film 3, enabling activation of the bonding film 3.

Here, the distance between the apply electrode 1015 and the movable stage 1020 (worked substrate W), or specifically the height of the gap 1102 (length h1 in FIG. 6) is appropriately selected taking into account such factors as the output of the high-frequency power supply 1017, and the type of plasma treatment performed on the worked substrate W. Preferably, the distance is about 0.5 to 10 mm, more preferably about 0.5 to 2 mm. In this way, the activation of the bonding film 3 by the plasma contact can be performed even more reliably.

The voltage applied between the apply electrode 1015 and the counter electrode 1019 is preferably from about 1.0 to 3.0 kVp-p, more preferably from about 1.0 to 1.5 kVp-p. This further ensures the generation of electric field E between the apply electrode 1015 and the movable stage 1020, and the processing gas G supplied into the gas supply channel 1018 can be reliably turned into a plasma gas.

The frequency of the high-frequency power supply 1017 (the frequency of applied voltage) is not particularly limited, and is preferably about 10 to 50 MHz, more preferably about 10 to 40 MHz.

The type of processing gas G is not particularly limited, and rare gases such as helium gas and argon gas, and oxygen gas can be used. These may be used in combinations of one or more. Gases containing a rare gas as the primary component are preferably used as the processing gas G, and gases containing helium gas as the primary component are particularly preferable.

More specifically, the plasma used for the treatment is preferably produced from a gas that contains helium gas as the primary component. The gas containing helium gas as the primary component (processing gas G) does not easily generate ozone when turned into a plasma gas, and thus the ozone alteration (oxidation) on the surface 32 of the bonding film 3 can be prevented. This suppresses the reduction in the extent of bonding film 3 activation; in other words, the bonding film 3 can be reliably activated. Further, the helium gas-based plasma has an extremely high Penning effect, and is therefore also preferable in terms of reliably activating the bonding film 3 in a short time period.

In this case, the supply rate of the gas that contains helium gas as the primary component to the gas supply cannel 1018 is preferably from about 1 to 20 SLM, more preferably from about 5 to 15 SLM. This makes it easier to control the extent of bonding film 3 activation.

The helium gas content of the gas (processing gas G) is preferably 85 vol % or more, more preferably 90 vol % or more (including 100%). In this way, the foregoing effects can be exhibited even more effectively.

The mobility rate of the movable stage 1020 is not particularly limited, and is preferably about 1 to 20 mm/second, more preferably about 3 to 6 mm/second. By allowing the plasma to contact the bonding film 3 at such a rate, the bonding film 3 can be sufficiently and reliably activated despite the short contact time.

3-2: Next, as illustrated in FIG. 4A, the transfer base material 21 and the first base material 22 are bonded to each other via the bonding film 3, with the bonding film 3 closely in contact with the first terminals 221 of the first base material 22. Here, because the surface 32 of the bonding film 3 has developed adhesion for the first terminals 221 in step 3-1, the bonding film 3 and the first terminals 221 of the first base material 22 are chemically bonded to each other, as illustrated in FIG. 4B.

The mechanism by which the bonding film 3 and the first terminals 221 of the first base material 22 are bonded to each other in this step is described below.

Taking as an example the first terminals 221 exposing the hydroxyl group on the surface, mating the transfer base material 21 and the first base material 22 with the bonding film 3 of the transfer base material 21 in contact with the first terminals 221 in this step produces hydrogen-bond attraction between the hydroxyl group on the surface 32 of the bonding film 3 and the hydroxyl group on the surface of the first terminals 221, thus generating an attraction force between the hydroxyl groups. Presumably, the transfer base material 21 and the first terminals 221 are bonded to each other by this attraction force.

The hydroxyl groups attracted to each other by hydrogen bonding are cut from the surfaces by accompanying dehydro-condensation, depending on temperature or other conditions. As a result, the atoms originally attached to the hydroxyl groups form bonds at the contact interface between the bonding film 3 and the first terminals 221. This is believed to be the basis of the strong bonding between the bonding film 3 and the first terminals 221.

When unterminated bonds, or specifically dangling bonds exist on the surface or inside the bonding film 3 of the transfer base material 21, and on the surface or inside the first terminals 221, these dangling bonds rejoin when the transfer base material 21 and the first base material 22 are mated together. The rejoining of the dangling bonds occurs in a complicated manner that involves overlap or tangling, and thus a network of bonds is formed on the bonded interface. As a result, the bonding film 3 and the first terminals 221 are strongly bonded to each other.

The activated state of the surface of the bonding film 3 activated in step 3-1 attenuates over time. It is therefore preferable that step 3-2 be performed as soon as step 3-1 is finished. Specifically, it is preferable to perform step 3-2 within 60 minutes after step 3-1, more preferably within 5 minutes after step 3-1. With these time ranges, the activated state of the bonding film 3 surface is sufficiently maintained, and sufficient bond strength can be obtained between the bonding film 3 and the first terminals 221 when the transfer base material 21 and the first base material 22 are mated to each other via the bonding film 3.

In other words, because the bonding film 3 before activation is a bonding film obtained by drying the silicone material, the bonding film 3 is relatively chemically stable, and excels in weather resistance. Thus, the bonding film 3 before activation is well suited for long storage. By taking advantage of this, the transfer base material 21 including such a bonding film 3 may be produced or purchased in a large quantity and stored for later use, and energy may be imparted as in step 3-1 only in a desired quantity. This is effective in terms of efficient manufacture of the bonded structure 1.

3-3: Next, the transfer base material 21 and the first base material 22 are separated from each other.

Because the bonding film 3 is formed on the liquid repellent film 211 of the transfer base material 21, the bond strength for the transfer base material 21 is extremely weak. In contrast, because the bonding film 3 is chemically bonded to the first terminals 221 of the first base material 22, the bond strength for the first base material 22 (first terminals 221) is much higher than that between the bonding film 3 and the transfer base material 21.

Thus, detaching the transfer base material 21 from the first base material 22 detaches the bonding film 3 from the bonding face 210 of the transfer base material 21, thus transferring the bonding film 3 from the transfer base material 21 to the first base material 22, as illustrated in FIG. 4C.

Step 4: Next, after the transfer, energy is imparted to the bonding film 3 to develop adhesion near the other surface of the bonding film 3, and the first base material 22 and the second base material 23 are bonded to each other via the bonding film 3 to obtain the temporarily bonded structure 1' of the first base material 22 and the second base material 23 (fourth step).

Note that because the second terminals 231 are provided at such positions as to overlap the first terminals 221 upon mating of the first base material 22 and the second base material 23 on the first and second terminals 221 and 231, the second terminals 231 are bonded to the bonding film 3 adhering to the first terminals 221 upon bonding of the first base material 22 and the second base material 23 via the bonding film 3 in this step 4, as illustrated in FIG. 4B.

This step is described below in detail.

4-1: First, energy is imparted to the bonding film 3 transferred from the transfer base material 21 to the first base material 22.

Because the bonding film. 3 has been transferred from the transfer base material 21 to the first base material 22, the surface originally bonded to the transfer base material 21 is exposed on the first base material 22.

The energy imparted to the bonding film 3 cuts some of the molecular bonds near the surface, and thereby activates the surface. As a result, adhesion is developed. Thus, in this step, the surface bonded to another base material (the transfer base material 21 in this embodiment) can also develop adhesion by imparting energy again.

Any method can be used to impart energy to the bonding film 3. However, it is particularly preferable, as in step 3-1, to expose the bonding film 3 to plasma, as illustrated in FIG. 4D.

4-2: Next, the first base material 22 and the second base material 23 are bonded to each other with the bonding film 3 formed on the first bonding material 22 closely in contact with the second terminals 231 of the second base material 23 (see FIG. 5A). Because the surface of the bonding film 3 has developed adhesion for the second terminals 231 in the foregoing step 4-1, the bonding film 3 and the second terminals 231 of the second base material 23 are chemically bonded to each other. As a result, the first base material 22 and the second base material 23 are partially bonded together via the bonding film 3 selectively formed in the film forming region 41. Specifically, the first terminals 221 and the second terminals 231 are bonded to each other via the bonding film 3 patterned into the predetermined shape, and the temporarily bonded structure 1' as illustrated in FIG. 5B is obtained.

In this step, the bonding film 3 and the second terminals 231 of the second base material 23 are bonded by the same mechanism by which the bonding film 3 and the first terminals 221 of the first base material 22 are bonded in step 3-2.

Step 5: Next, pressure is applied to the temporarily bonded structure 1' in the thickness direction of the bonding film 3, specifically in a direction to bring the first base material 22 and the second base material 23 towards each other (fifth step).

Figure 5C:
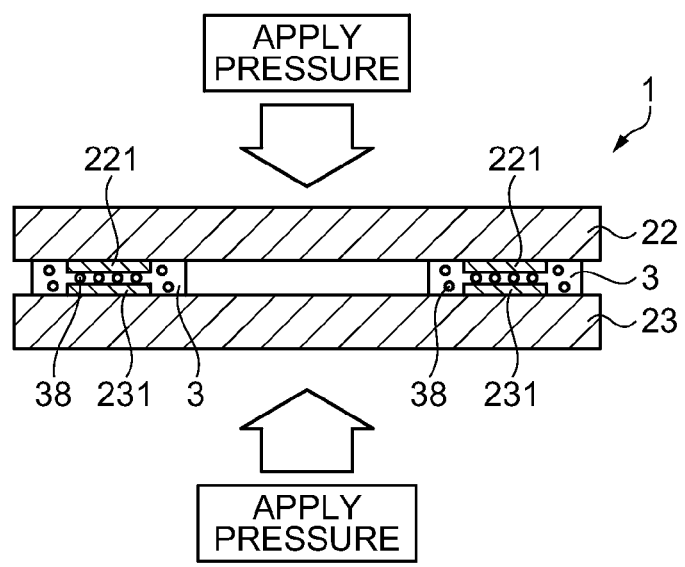
Figure 6:
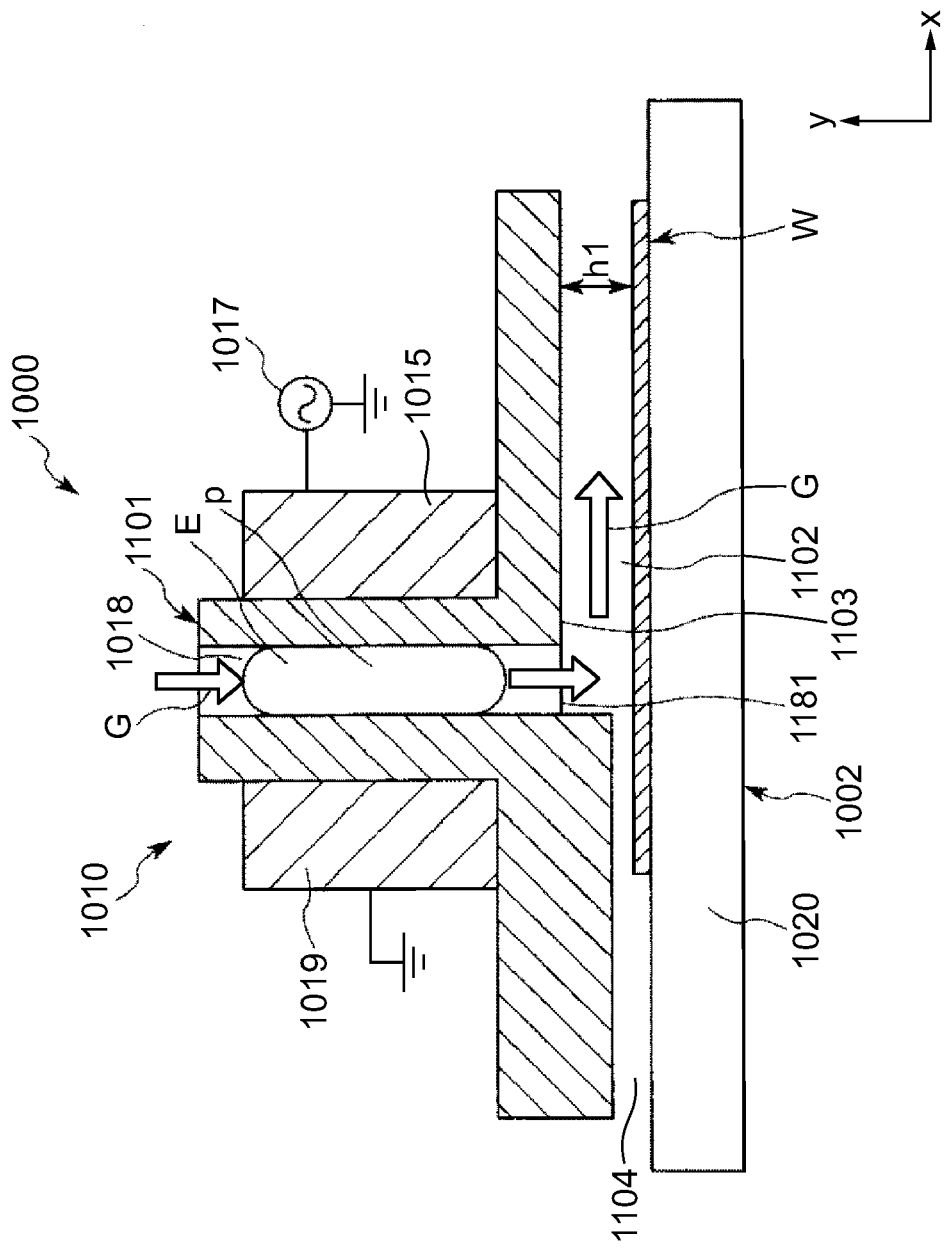
FIG. 6 is a schematic diagram illustrating an atmospheric pressure plasma apparatus used for contacting plasma with a bonding film.

As illustrated in FIG. 5C, the applied pressure maintains the connection between the first base material 22 and the second base material 23 via the bonding film 3, and electrically connects the first terminals 221 and the second terminals 231 to each other via the conductive particles 38 in the bonding film 3. As a result, the bonded structure 1 is produced in which the first base material 22 and the second base material 23 are strongly and electrically bonded to each other via the bonding film 3.

The applied pressure to the temporarily bonded structure 1' in the thickness direction of the bonding film 3 makes electrical connections between the first terminals 221 and the second terminals 231 via the conductive particles 38 according to the following principle.

By the applied pressure to the temporarily bonded structure 1' in the thickness direction of the bonding film 3, the thickness of the bonding film 3 is reduced as the first terminals 221 and the second terminals 231 approach towards each other. As a result, the conductive particles 38 in the bonding film 3 make contact with one another in the thickness direction, and with the surfaces of the first and second terminals 221 and 231, electrically connecting the first terminals 221 and the second terminals 231 to each other via the conductive particles 38.

Note that the electrical connections between the first and second terminals 221 and 231 via the conductive particles 38 may be made via a multiplicity of conductive particles 38, or via a single conductive particle 38 as illustrated in FIG. 5C.

The applied pressure to the temporarily bonded structure 1' is set to preferably about 0.2 to 100 MPa, more preferably about 1 to 50 MPa, though it is appropriately adjusted according to conditions such as the material and thickness of the first base material 22 and the second base material 23, the material and thickness of the first terminals 221 and the second terminals 231, and the material and average particle diameter of the conductive particles 38.

The pressure time is not particularly limited, and is preferably about 10 seconds to 30 minutes.

Applying pressure to the temporarily bonded structure 1' in the thickness direction of the bonding film 3 under these conditions can improve the reliability of the electrical connections between the first terminals 221 and the second terminals 231 via the conductive particles 38.

Preferably, pressure is applied to the temporarily bonded structure 1' in the thickness direction of the bonding film 3 under heat.

In this way, the bonding film 3 does not return to the original shape and substantially maintains its shape in the bonded structure 1 even after the pressure applied to the temporarily bonded structure 1' in the thickness direction of the bonding film 3 is released. Specifically, the electrical connections between the first terminals 221 and the second terminals 231 via the conductive particles 38 can be reliably maintained.

The heating temperature of the bonded structure 1 is not particularly limited, as long as it is above room temperature, and below the heat resistant temperature of the bonded structure 1. Preferably, the heating temperature is about 25 to 100° C., more preferably about 50 to 100° C. With the heating temperature in these ranges, the heat alteration or degradation of the bonded structure 1 can be reliably prevented, and the bonding film 3 can substantially maintain its shape even after the release of the applied pressure in the thickness direction of the bonding film 3.

As described above, a bonding method according to an embodiment produces the bonded structure 1 by first forming the bonding film 3 in advance on the transfer base material that includes the liquid repellent film 211. After transferring the bonding film 3 from the transfer base material 21 to the first base material 22, the first base material 22 and the second base material 23 are then bonded to each other via the bonding film 3 and pressed together. In this way, the wettability spread of the liquid material 35 on the transfer base material 21 can be appropriately suppressed or prevented, and the bonding film. 3 can be formed in patterns corresponding to the shape of the film forming region 41 even when the film forming region 41 has microscopic dimensions. The bonding film 3 can then be transferred from the transfer base material 21 to the first base material 22, ensuring that the bonded structure 1 is obtained in which the first terminals 221 and the second terminals 231 are electrically connected to each other between the first base material 22 and the second base material 23 via the bonding film 3.

As illustrated in FIG. 5C, the bonding film 3 is provided to correspond to the opposing first and second terminals 221 and 231. In other words, the bonding film 3 is individually provided for the adjacent first terminals 221 (second terminals 231). This reliably prevents shorting between the adjacent first terminals 221 (second terminals 231) due to migration in the bonding film 3, which may occur when a bonding film such as an anisotropic conductive film (ACF) or an anisotropic conductive paste (ACP) is formed over the adjacent first terminals 221 (second terminals 231) to make electrical connections between the first terminals 221 and the second terminals 231 altogether.

In the bonded structure 1 of the foregoing configuration, the adhesion providing the bonding between the first and second terminals 221 and 231 is not based on physical bonding by the anchor effect as in the adhesive used in the bonding methods of the related art, but rather is based on strong chemical bonds, such as covalent bonds, that are formed in a short time period. Thus, the bonded structure 1 can be formed in a short time period, and is extremely resistant to detaching, and rarely involves uneven bonding or other defects.

Because the bonding method does not require a high-temperature heat treatment (for example, 700° C. or more), the first base material 22 and the second base material 23 can be bonded even when these materials are made of low heat resistant materials.

When the first base material 22 and the second base material 23 have different coefficients of thermal expansion, the bonding temperature should be kept as low as possible. By bonding under low temperatures, the thermal stress that generates at the bonded interface can be further reduced.

Specifically, the first base material 22 and the second base material 23 are bonded to each other at the material temperature of about 25 to 50° C., more preferably about 25 to 40° C., though it depends on the difference in the coefficient of thermal expansion between the first base material 22 and the second base material 23. With these temperature ranges, the thermal stress generated at the bonded interface can be sufficiently reduced even when there is some large difference in the coefficient of thermal expansion between the first base material 22 and the second base material 23. As a result, defects such as warping and detachment can be reliably suppressed or prevented in the bonded structure 1.

Specifically, in this case, when the difference in the thermal expansion coefficients of the first base material 22 and the second base material 23 is $5 \times 10^{-5}$/K or more, it is particularly recommended that bonding be performed at as low a temperature as possible.

The bonded structure (a bonded structure of an embodiment) 1 illustrated in FIG. 5B can be obtained in the manner described above.

In the bonded structure 1 obtained as above, the bond strength between the first base material 22 and the second base material 23 is preferably 4 MPa (40 kgf/cm$^2$) or more, more preferably 10 MPa (100 kgf/cm$^2$) or more. The bonded structure having such a bond strength can sufficiently prevent detachment. Further, with a bonding method according to an embodiment, the bonded structure 1 can be efficiently produced in which the first base material 22 and the second base material 23 are bonded to each other with a large bond strength.

The bonding film 3 has a volume resistivity of preferably $1 \times 10^5$ Ω·cm or less, more preferably $1 \times 10^4$ Ω·cm or less in the thickness direction. In this way, conduction is ensured between the first terminals 221 and the second terminals 231 via the bonding film 3. Further, with a bonding method according to an embodiment, the bonding film 3 with such excellent conductivity can be efficiently produced.

Second Embodiment

A Second Embodiment of a bonding method is described below.

FIGS. 7A to 7C and FIGS. 8A to 8C are diagrams (longitudinal sections) explaining a Second Embodiment of a bonding method. In the descriptions below, the upper and lower sides of FIGS. 7A to 7C and FIGS. 8A to 8C will be referred to as "upper" and "lower", respectively.

The description of the Second Embodiment will be given with a primary focus on differences from the bonding method of the First Embodiment, and matters already described will not be described again.

In a bonding method according to the present embodiment, in addition to the bonding film 3 formed in the film forming region 41 on the bonding face (surface) 210 of the transfer base material 21, a bonding film 3' is formed over substantially the entire area of the bonding face 220 of the first base material 22 on the side of the first terminals 221, and over the substantially entire area of the bonding face 230 of the second base material 23 on the side of the second terminals 231, using a liquid material that does not contain conductive particles 38. Then, adhesion is developed near a surface of each bonding film 3' on the first base material 22 and the second base material 23, and the bonding films 3' are brought into contact with each other via the bonding film 3 transferred from the transfer base material 21. This bonds the first terminals 221 and the second terminals 231 between the first base material 22 and the second base material 23, thus obtaining the temporarily bonded structure 1'. Thereafter, pressure is applied to the temporarily bonded structure 1' to make electrical connections between the first terminals 221 and the second terminals 231 via the conductive particles 38, thus obtaining the bonded structure 1.

The following describes each step.

Step 1': The transfer base material 21, the first base material 22, and the second base material 23 are prepared as in step 1.

Step 2': The bonding film 3 patterned into a predetermined shape is formed in the film forming region 41 on the bonding face 220 of the transfer base material 21 as in step 2.

Then, the bonding film 3' containing no conductive particles 38 is formed over substantially the entire area of the bonding face 220 of the first base material 22 on the side of the first terminals 221, using a liquid material that contains a silicone material but does not contain the conductive particles 38, i.e., the liquid material 35 of step 2 without the conductive particles 38. In the same manner, the bonding film 3' containing no conductive particles 38 is formed over substantially the entire area of the bonding face 230 of the second base material 23 on the side of the second terminals 231.

The bonding film 3' containing no conductive particles 38 can be formed on the first base material 22 and the second base material 23 according to the method described in step 2, using a silicone material-containing liquid material instead of the liquid material 35 that contains both the silicone material and the conductive particles 38.

The average thickness of the bonding films 3' formed on the first base material 22 and the second base material 23 is set as thin as possible, preferably about 0.1 to 10 μm, more preferably about 0.5 to 5 μm. In this way, the bonding films 3' can reliably develop adhesion near surfaces when energy is imparted to the bonding films 3' in the next steps 3' and 4'.

Further, it is ensured that the first terminals 221 and the second terminals 231 are electrically connected to each other via the conductive particles 38 upon application of pressure to the temporarily bonded structure 1' in the thickness direction of the bonding film 3 in a later step 5'.

Figure 7A:
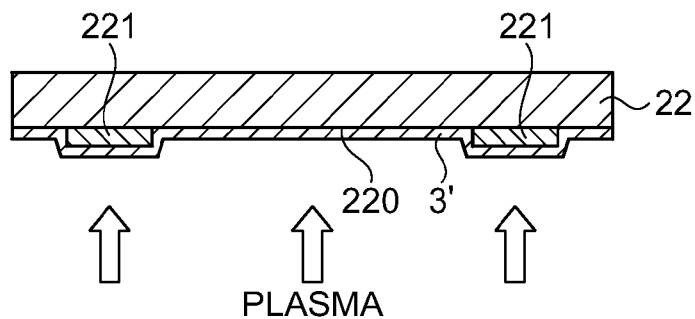
FIGS. 7A to 7C are longitudinal sectional views explaining a Second Embodiment of a bonding method.

Step 3': Next, as illustrated in FIG. 7A, energy is imparted to the bonding film 3' formed on the bonding face 220 side of the first base material 22 to develop adhesion near the surface of the bonding film 3' formed on the first base material 22.

Figure 7B:
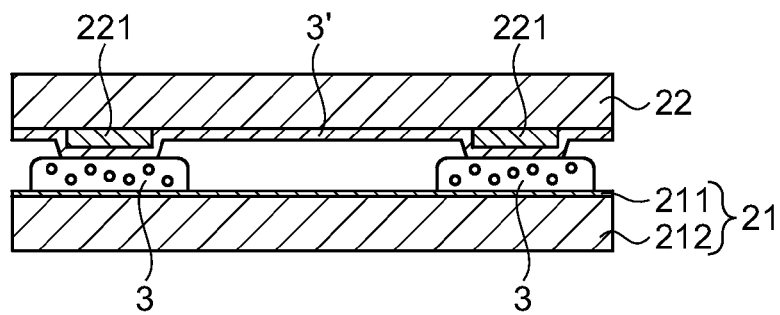
Figure 7C:
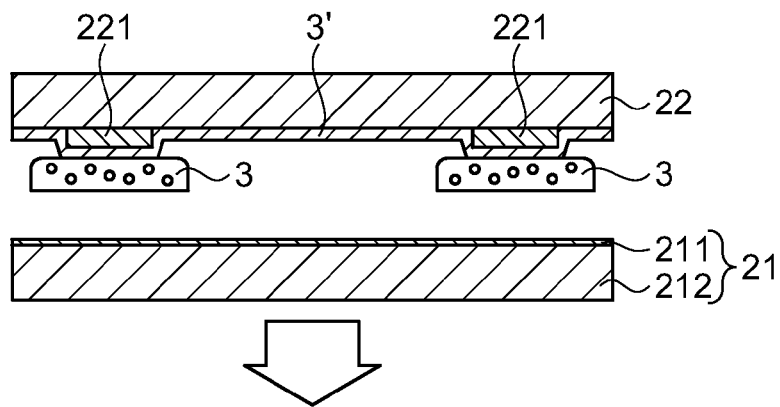

Then, as illustrated in FIG. 7B, the transfer base material 21 and the first base material 22 are bonded to each other via the bonding film 3 formed on the transfer base material 21 and the bonding film 3' formed on the first base material 22, and then separated from each other to transfer the bonding film 3 of the transfer base material 21 to the first base material 22 (see FIG. 7C).

By providing the bonding film 3' for the first base material 22 in addition to the bonding film 3 provided for the transfer base material 21 as in the present embodiment, a strong bond can be formed between the bonding film 3 and the bonding film 3'. Thus, the bonding film 3 formed on the transfer base material 21 can be more reliably detached from the transfer base material 21.

Note that energy can be imparted to the bonding film 3' of the first base material 22 according to the methods described in step 3. Plasma exposure of the bonding film 3 is particularly preferable.

Further, energy may be imparted not only to the bonding film 3' of the first base material 22 but also to the bonding film 3 of the transfer base material 21. Furthermore, instead of imparting energy to the bonding film 3' of the first base material 22, energy may be imparted only to the bonding film 3 of the transfer base material 21.

Figure 8A:
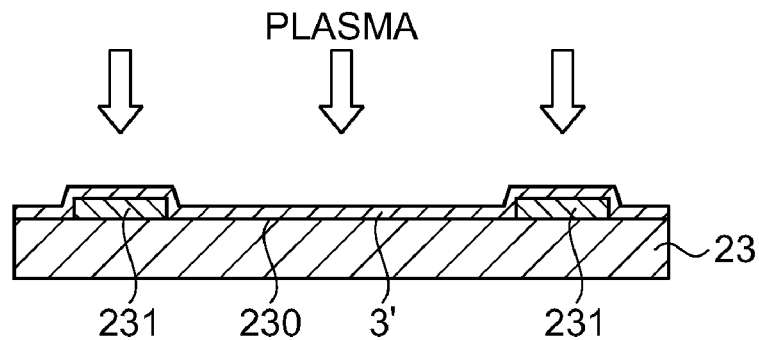
FIGS. 8A to 8C are longitudinal sectional views explaining the Second Embodiment of a bonding method.

Step 4': Next, as illustrated in FIG. 8A, energy is imparted to the bonding film 3' formed on the bonding face 230 side of the second base material 23 to develop adhesion near the surface of the bonding film 3' formed on the second base material 23.

Figure 8B:
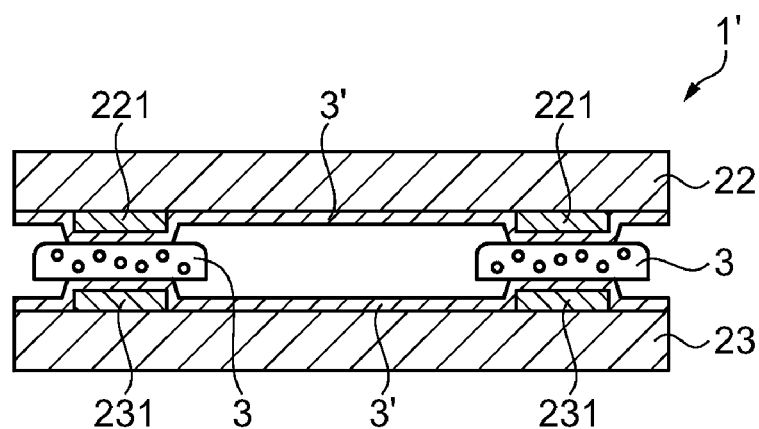

Then, as illustrated in FIG. 8B, the bonding film 3 transferred to the first base material 22 is brought into contact with the bonding film 3' formed on the second base material 23, so as to bond these bonding films 3 and 3'. As a result, the bonded structure 1' is obtained in which the first base material 22 and the second base material 23 are bonded to each other via the two bonding films 3' and the single bonding film 3.

Providing the bonding film 3' for the second base material 23 in addition to the bonding film 3 transferred to the first base material 22 as in this embodiment increases the bond strength between the bonding film 3 and the bonding film 3'. Accordingly, the resulting bonded structure 1' has improved bond strength.

Further, energy may be imparted not only to the bonding film 3' of the second base material 23 but also to the bonding film 3 transferred to the first base material 22. Furthermore, instead of imparting energy to the bonding film 3' of the second base material 23, energy may be imparted only to the bonding film 3 transferred to the first base material 22.

Step 5': Next, pressure is applied to the temporarily bonded structure 1' in the thickness direction of the bonding film 3 as in step 5, specifically in a direction to bring the first base material 22 and the second base material 23 towards each other.

Figure 8C:
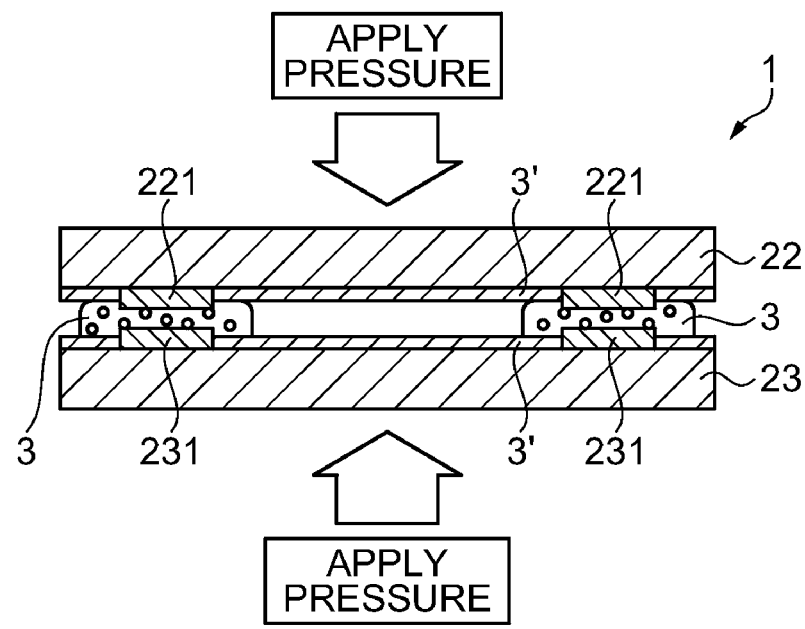

As illustrated in FIG. 8C, the applied pressure maintains the connection between the first base material 22 and the second base material 23 via the bonding films 3 and 3', and electrically connects the first terminals 221 and the second terminals 231 to each other via the conductive particles 38 in the bonding film 3. As a result, the bonded structure 1 is produced in which the first base material 22 and the second base material 23 are strongly and electrically connected to each other via the bonding films 3 and 3'.

In the presently described embodiment, two bonding films 3' are interposed between the first terminals 221 and the second terminals 231, in addition to the bonding film 3. However, these bonding films 3' are also compressed with the bonding film 3 by the pressure applied to the temporarily bonded structure 1'. Thus, the conductive particles 38 in the bonding film 3 eventually make contact with one another in the thickness direction, and the first terminals 221 and the second terminals 231 are electrically connected to each other via the conductive particles 38 as in the First Embodiment.

Thus, the bonded structure 1 can alternately be obtained in this manner.

The present embodiment has been described through the case where the bonding film 3' is formed on both the bonding faces (surfaces) 220 and 230 of the first base material 22 and the second base material 23. However, the invention is not limited to this, and the bonding film 3' may be formed on either one of the bonding faces (surfaces) 220 and 230.

The bonding method according to various embodiments as described above can be used for the bonding of terminals of various base materials (members). Specifically, a bonded structure according to an embodiment of the present invention is applicable to structures in which the terminals of a variety of members are bonded to each other via a bonding film.

The following embodiment describes a transmissive liquid crystal display device that uses a bonded structure of an embodiment.

Liquid Crystal Display Device

Figure 9:
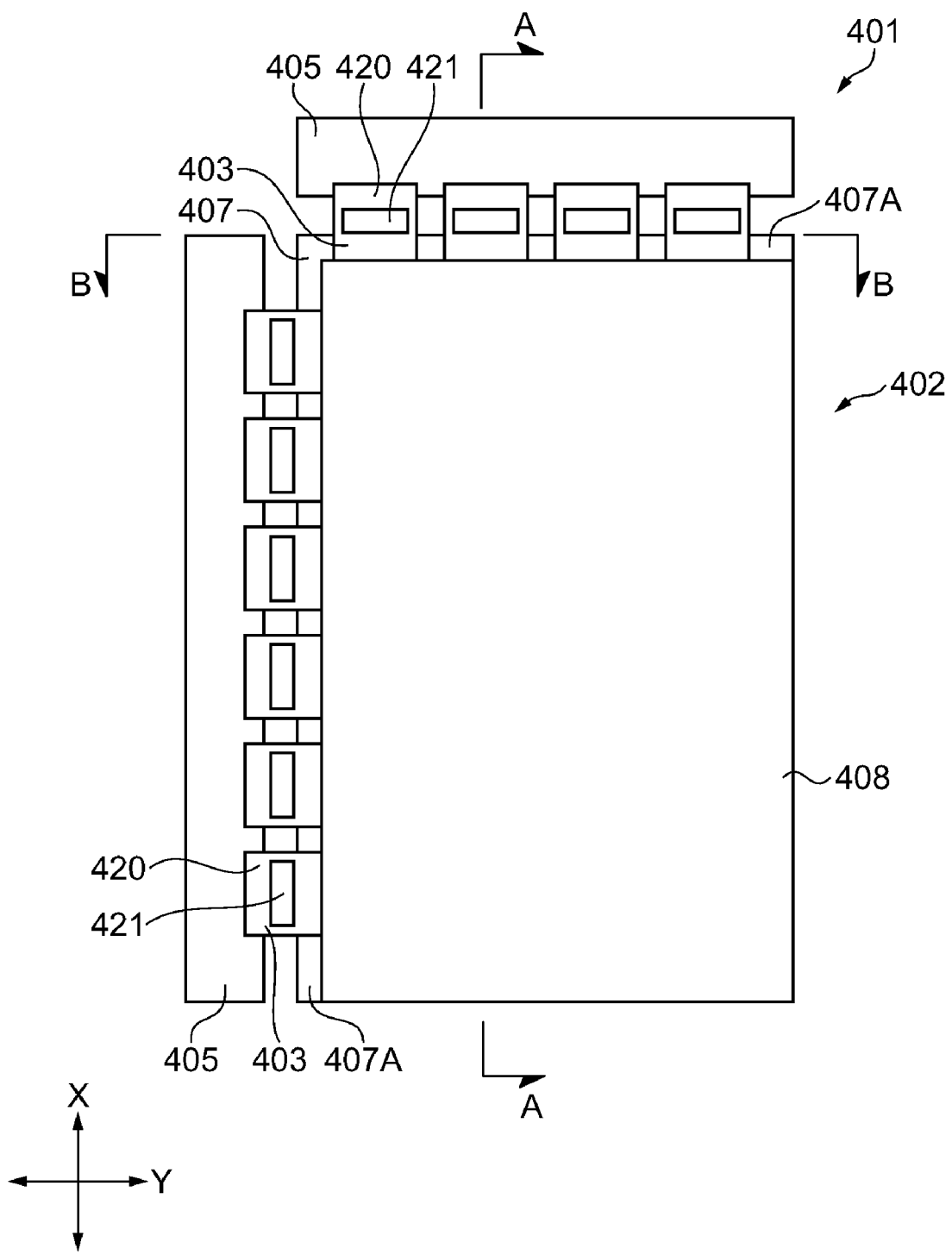
FIG. 9 is a top view of a transmissive liquid crystal display device using a bonded structure.
Figure 10:
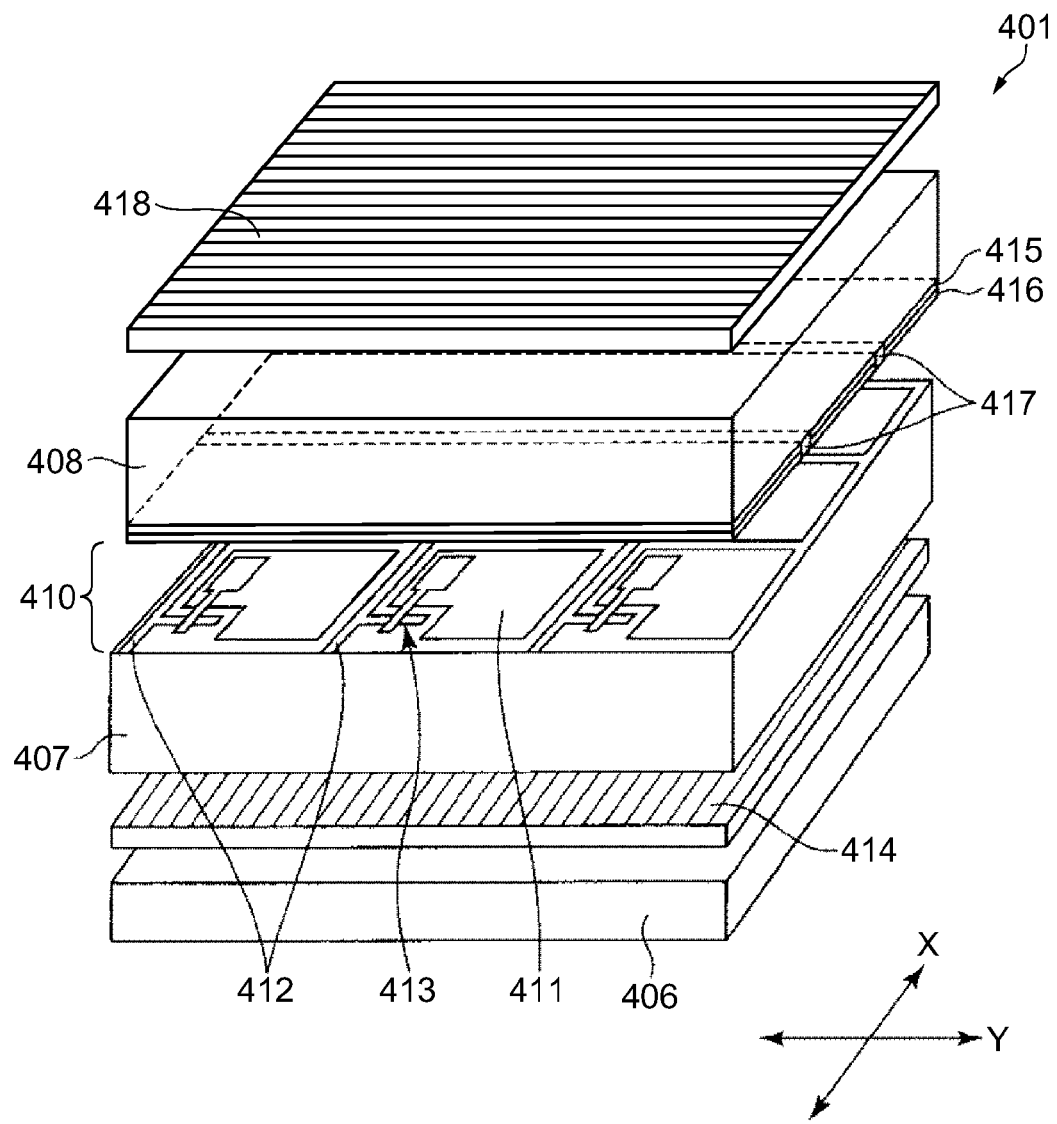
FIG. 10 is an exploded perspective view of a liquid crystal panel provided in the liquid crystal display device of FIG. 9.
Figure 11:
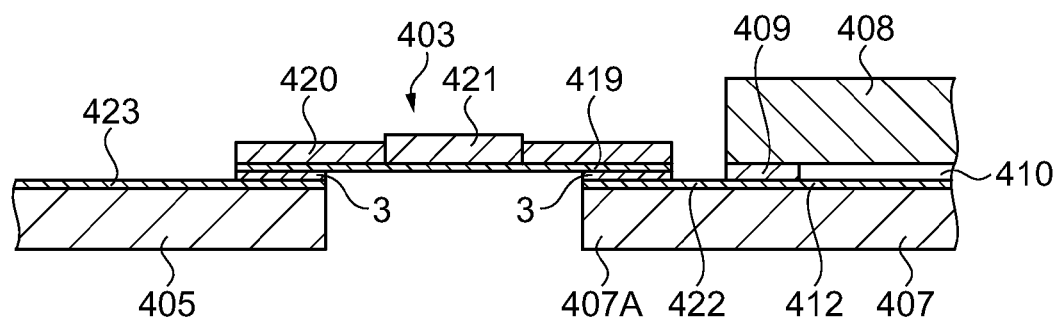
FIG. 11 is a cross sectional view at line A-A of FIG. 9.
Figure 12:
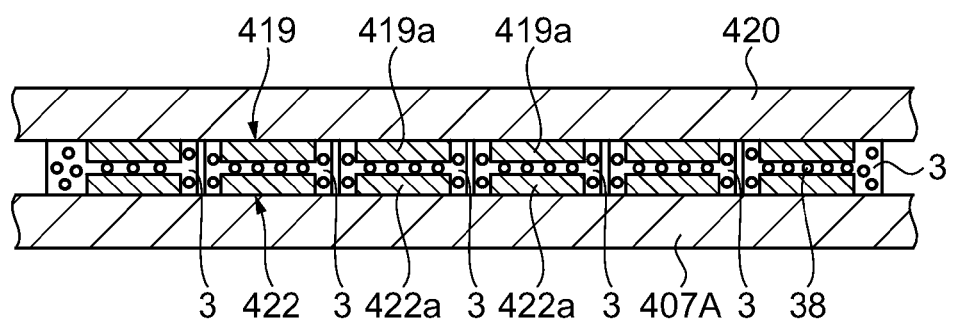
FIG. 12 is a cross sectional view at line B-B of FIG. 9.

FIG. 9 is a plan view of a transmissive liquid crystal display device. FIG. 10 is an exploded perspective view of a liquid crystal panel provided in the transmissive liquid crystal display device of FIG. 9. FIG. 11 is a cross sectional view taken at line A-A of FIG. 9. FIG. 12 is a cross sectional view taken at line B-B of FIG. 9. Note that, in the figures, some members are omitted for simplicity. Further, in the descriptions below, the terms "upper" and "lower" are used to denote the direction out of the plane of the paper and the direction into the plane of the paper, respectively, in FIG. 9. Further, the upper side and lower side of FIG. 10 to FIG. 12 will be referred to as "upper" and "lower", respectively.

A transmissive liquid crystal display device (hereinafter, simply "liquid crystal display device") 401 illustrated in the figures includes a liquid crystal panel (display panel) 402, a plurality of driver IC packages 403 that drives the liquid crystal panel 402, two input wiring boards 405, and a backlight (light source) 406. The liquid crystal display device 401 is operable to display images (information) using the light produced by the backlight 406 and transmitted through the liquid crystal panel 402.

The liquid crystal panel 402 includes a pair of opposing lower substrate 407 and upper substrate 408, and a sealing member 409 (see FIG. 11) provided between the lower substrate 407 and the upper substrate 408 to surround a display region.

The space defined by the lower substrate 407, the upper substrate 408, and the sealing member 409 contains the electrooptic material liquid crystal, forming a liquid crystal layer 410, as illustrated in FIG. 10 and FIG. 11.

The lower substrate 407 and the upper substrate 408 are made of, for example, various glass materials, and various resin materials.

A plurality of pixel electrodes 411 disposed in a matrix (in rows and columns), and signal electrodes 412 that extend along the X direction are formed on the upper surface of the lower substrate 407 (on the side of the liquid crystal layer 410). The pixel electrodes 411 of each column are connected to one of the signal electrodes 412 via switching elements 413 such as TFD elements and TFT elements.

A polarizing plate 414 is provided on the lower surface of the lower substrate 407.

A plurality of band-like scan electrodes 415 is provided on the lower face of the upper substrate 408 (on the side of the liquid crystal layer 410). The scan electrodes 415 are provided as the counter electrodes of the pixel electrodes 411 by being disposed substantially parallel to each other with predetermined intervals along the Y direction substantially orthogonal to the signal electrodes 412.

The overlap region (including the areas around it) between the pixel electrodes 411 and the scan electrodes 415 defines a pixel, and the liquid crystal in the liquid crystal layer 410 is driven (undergoes changes in orientation) for each pixel between these electrodes.

As illustrated in FIG. 9, the lower substrate 407 has a flanged portion (frame) 407A that flanges outwardly (towards left and upward in FIG. 9) from the outer edge of the upper substrate 408 in a plan view.

The upper surface of the flanged portion 407A includes interconnection patterns 422 continuous to the signal electrodes 412 and the scan electrodes 415.

The lower face of each scan electrode 415 includes colored filters (color filters) 416 of red (R), green (G), and blue (B), which are parted from one another by a black matrix 417.

The upper surface of the upper substrate 408 includes a polarizing plate 418 having a polarizing axis different from that of the polarizing plate 414.

In the liquid crystal panel 402 configured as above, the light from the backlight 406 is polarized by the polarizing plate 414, and then enters the liquid crystal layer 410 through the lower substrate 407 and the pixel electrodes 411. The incident light on the liquid crystal layer 410 undergoes intensity modulation through the liquid crystal whose orientation is controlled for each pixel. The intensity-modulated light then passes through the colored layers 416, the scan electrodes 415, and the upper substrate 408, and emerges out of the device after being polarized by the polarizing plate 418. In this manner, the liquid crystal display device 401 produces color images (including moving and still images) of, for example, characters, numerals, and graphics on the opposite side of the upper substrate 408 from the liquid crystal layer 410.

As illustrated in FIG. 9 and FIG. 11, each driver IC package 403 includes a flexible substrate 420 provided with driving interconnection patterns 419, and a driver IC 421 contained in the flexible substrate 420 and electrically connected to the driving interconnection patterns 419.

The driver IC 421 functions to generate drive signals supplied to the signal electrodes 412 and the scan electrodes 415, and is realized by a semiconductor chip.

As illustrated in FIG. 12, the driving interconnection patterns 419 are provided in stripes, corresponding to the interconnection patterns 422. The driving interconnection patterns 419 include wires 419a respectively connected (bonded) at one end to wires 422a of the interconnection patterns 422.

Each input wiring board 405 is a printed wiring board with input interconnection patterns 423, and serves to transmit signals (for example, image signals) from a circuit board (not shown) mounting a power IC and a control IC to each driver IC 421 via the input interconnection patterns 423.

The input interconnection patterns 423 are provided to respectively correspond to the drive interconnection patterns 419, and the wires of the input interconnection patterns 423 are respectively connected (bonded) at one end to the wires 419a of the drive interconnection patterns 419. At the other end, the wires of the input interconnection patterns 423 are respectively connected to the wires of the circuit substrate.

In this manner, in the driving system of the liquid crystal display device 401 configured as above, signals from the circuit board are input to the driver ICs 421 via the input interconnection patterns 423 and the drive interconnection patterns 419, and the driver ICs 421 generate drive signals supplied to the signal electrodes 412 and the scan electrodes 415. The drive signals generated by the driver ICs 421 on the signal electrode side (the driver ICs 421 along the Y direction of FIG. 9) are supplied to the switching elements via the drive interconnection patterns 419 and the signal electrodes 412. The switching elements then supply current to the pixel electrodes 411 according to the supplied drive signals. The drive signals generated by the driver ICs 421 on the scan electrode 415 side (the driver ICs 421 along the X direction of FIG. 9) are supplied to the scan electrodes 415 via the drive interconnection patterns 419. As a result, the liquid crystal in the liquid crystal layer 410 is driven (undergoes changes in orientation) for each pixel between the pixel electrodes 411 and the scan electrodes 415.

In the liquid crystal display device as above, a bonding method of the present invention is used for the bonding between the flanged portion 407A including the interconnection patterns 422 and the driver IC packages 403 including the drive interconnection patterns 419, and between the input wiring boards 405 and the driver IC packages 403, as illustrated in FIG. 11.

In other words, a bonded structure of the present invention is used for at least one of the bonded structure of the flanged portion 407A and the driver IC packages 403 via the bonding film 3, and the bonded structure of the input wiring boards 405 and the driver IC packages 403 via the bonding film 3.

In this case, the bonding film corresponding to the shape of the interconnection patterns 422 is transferred from the transfer substrate to the flanged portion 407A, and the surface of the flanged portion 407A on the side of the interconnection patterns 422 is bonded to the surface of the flexible substrates 420 of the driver IC packages 403 on the side of the drive interconnection patterns 419 via the bonding film. 3. The bonded structure of these members can be obtained this way.

In the present embodiment, for example, as illustrated in FIG. 12, the bonding between each wire 422a of the interconnection patterns 422 and each wire 419a of the drive interconnection patterns 419 is made via the bonding film 3 provided to correspond to each wire 422a. The wires 419a and 422a are thus bonded and electrically connected to each other via the bonding film 3. In this manner, in the present embodiment, because the bonding film 3 is individually provided for each wire 422a, short circuit between adjacent wires 422a that may occur because of migration can be reliably prevented.

A description has been made with respect to certain embodiments of bonding methods and bonded structures with reference to the attached drawings. It should be noted however that the invention is not limited to the foregoing descriptions.

For example, in a bonding method of the invention, one or more steps may be added for any purpose, as desired.

Further, a bonded structure of the invention is to be construed as also being applicable to fields other than liquid crystal display devices. Specifically, a bonded structure of the invention is applicable to, for example, bonded structures of a mount substrate and various kinds of members, including semiconductor elements such as memory; piezoelectric elements such as crystal oscillators; photoelectric converting elements such as solar cells; MEMS (Micro Electro Mechanical Systems) components such as micromirrors; sensor components such as pressure sensors and acceleration sensors; and display device components such as organic EL elements and electrophoretic display elements.

EXAMPLES

The following describes specific examples.

Example 1

First, the transfer base material was prepared by forming a polytetrafluoroethylene (PTFE) film on a surface of a monocrystalline silicon substrate (length 20 mm×width 20 mm×average thickness 1 mm). The first base material and the second base material were prepared from glass substrates having stripe interconnection patterns. Then, the surfaces of the first and second base materials on the side of the interconnection patterns were subjected to a surface treatment by oxygen plasma.

Each glass substrate had the dimensions of length 20 mm×width 20 mm×average thickness 1 mm. The stripe interconnection patterns were prepared from a copper thin film formed to protrude out of the glass substrate, and were dimensioned to provide a wire width of 200 μm and a wire pitch of 200 μm.

Next, a silicone material was prepared using a solution that contained a polyester-modified silicone material (Momentive Performance Materials Inc., Japan; XR32-A1612). The liquid material was prepared by dispersing Au-plated polystyrene particles (conductive particles; an average particle diameter of 5 μm) in the solution with the content of 10 wt % in the product bonding film. The liquid material was then supplied in 5-pL droplets onto the PTFE film side of the transfer base material using the droplet discharge apparatus 500, so as to form a liquid coating corresponding to the shape of the interconnection patterns formed on the glass substrate.

The liquid coating was then dried and cured by heating it at 200° C. for 1 hour, so as to form a bonding film (average thickness: about 20 μm; the width of bonding film: 210 μm; the bonding film pitch: 180 μm) on the transfer base material.

Then, a plasma was brought into contact with the bonding film formed on the transfer base material under the conditions below, using the atmospheric pressure plasma apparatus illustrated in FIG. 6. The bonding film was activated in this manner to develop adhesion to the bonding film surface.

Conditions of Plasma Treatment
Processing gas: Mixed gas of helium gas and oxygen gas
Gas supply rate: 10 SLM
Distance between electrodes: 1 mm
Applied voltage: 1 kVp-p
Voltage frequency: 40 MHz
Mobility rate: 1 mm/sec Thereafter, in order to bond the bonding film to the interconnection patterns, the transfer base material and the first base material were mated to each other in such a manner that the plasma contacted surface of the bonding film corresponding to the shape of the interconnection patterns was in contact with the surface of the interconnection patterns of the first base material.

The transfer base material and the first base material were then separated from each other to transfer the bonding film from the transfer base material to the first base material.

Thereafter, a plasma was brought into contact with the bonding film transferred onto the first base material, using the atmospheric pressure plasma apparatus of FIG. 6 under the foregoing conditions. The bonding film was reactivated in this manner to develop adhesion to the bonding film surface.

Then, the first base material and the second base material were mated with each other with the plasma-contacted surface of the bonding film in contact with the surface of the interconnection patterns of the second base material, so as to bond the bonding film to the interconnection patterns and thereby obtain a temporarily bonded structure in which the first and second base materials were bonded to each other via the bonding film.

The temporarily bonded structure was then maintained at ordinary temperature (about 25° C.) for 20 seconds while simultaneously applying a pressure of 50 MPa in the thickness direction of the bonding film, specifically in a direction to bring the first base material and the second base material towards each other. As a result, the conductive particles contained in the bonding film made contact with one another in the thickness direction, and the interconnection patterns of the two base materials were electrically connected to each other.

After these steps, a bonded structure was obtained in which the interconnection patterns of the first base material and the interconnection patterns of the second base material were electrically connected to each other via the conductive particles contained in the bonding film.

The bond strength between the first base material and the second base material of the bonded structure was determined as 4 MPa or more by the measurement using a Romulus (Quad Group Inc.).

Note that the bonding film formed to correspond to each wire did not bind to the adjacent bonding film over the wire pitch, and was independent from each other in the product bonded structure.

Example 2

A bonded structure was obtained as in Example 1, except that a stainless steel substrate with stripe interconnection patterns was prepared as the first base material instead of the glass substrate with the stripe interconnection patterns, and that a polyimide substrate with stripe interconnection patterns was prepared as the second base material instead of the glass substrate with the stripe interconnection patterns.

As in Example 1, the bond strength between the first and second base materials of the bonded structure was 4 MPa or more, and the bonding film formed to correspond to each wire did not bind to the adjacent bonding film over the wire pitch, and was independent from each other in the product bonded structure.

Example 3

A bonded structure was obtained as in Example 1, except that a bonding film (0.5 μm) was formed over substantially the entire surfaces of the first and second base materials on the side of the interconnection patterns using the same liquid material used to form the bonding film on the transfer base material but which did not contain the conductive particles, and that the first and second base materials with such bonding films were used.

As in Example 1, the bond strength between the first and second base materials of the bonded structure was 4 MPa or more, and the bonding film formed to correspond to each wire did not bind to the adjacent bonding film over the wire pitch, and was independent from each other in the product bonded structure.

What is claimed is:
1. A bonding method comprising:
 (1) preparing a first base material, a second base material, and a transfer base material, the first base material hav- ing a first terminal, the second base material having a second terminal, and the transfer base material having a liquid repellency-imparted surface that is repellent against a silicone material- and conductive particle-containing liquid material;

(2) applying the silicone material- and conductive particle-containing liquid material to the liquid repellency-imparted surface of the transfer base material to form a liquid coating in patterns of a predetermined shape, and drying the liquid coating to obtain a bonding film patterned into the predetermined shape;

(3) imparting energy to the bonding film to provide adhesion near a surface of the bonding film, and thereafter bonding the transfer base material and the first base material to each other via the bonding film, and then separating the transfer base material and the first base material from each other to transfer the bonding film from the transfer base material to the first base material;

(4) imparting energy to the bonding film after the transfer to provide adhesion near another surface of the bonding film, and bonding the first base material and the second base material to each other via the bonding film to obtain a temporarily bonded structure of the first base material and the second base material; and (5) applying pressure to the temporarily bonded structure in a thickness direction of the bonding film to finalize the bonding between the first base material and the second base material via the bonding film and electrically connect the first terminal and the second terminal via the conductive particles contained in the bonding film, so as to obtain a bonded structure.

2. The bonding method according to claim 1, wherein the first terminal and the second terminal are provided at positions that overlap and face each other upon mating the first base material and the second base material.

3. The bonding method according to claim 2, wherein the predetermined shape corresponds in shape to the first terminal upon transfer of the bonding film to the first base material in step (3).

4. The bonding method according to claim 1, wherein, in step (2), a bonding film containing no conductive particles is formed on the first base material over substantially an entire surface to be bonded to the second base material via the bonding film.

5. The bonding method according to claim 1, wherein, in step (2), a bonding film containing no conductive particles is formed on the second base material over substantially an entire surface to be bonded to the first base material via the bonding film.

6. The bonding method according to claim 1, wherein, in step (2), the liquid coating is formed by supplying the liquid material in droplets using a droplet discharge method.

7. The bonding method according to claim 6, wherein the droplet discharge method is an inkjet method by which the liquid material is discharged in droplets through a nozzle hole of an inkjet head using vibration of a piezoelectric element.

8. The bonding method according to another to claim 1, wherein the silicone material- and conductive particle-containing liquid material includes a silicone material having a main backbone of polydimethylsiloxane, and wherein the main backbone is branched.

9. The bonding method according to claim 8, wherein at least one methyl group of the polydimethylsiloxane in the silicone material is substituted with a phenyl group.

10. The bonding method according to claim 1, wherein the silicone material- and conductive particle-containing liquid material includes a silicone material including a plurality of silanol groups.

11. The bonding method according to claim 1, wherein the silicone material- and conductive particle-containing liquid material includes a silicone material that is a polyester-modified silicone material obtained by a dehydrocondensation reaction with polyester resin.

12. The bonding method according to claim 11, wherein the polyester resin is the product of esterification reaction between saturated polybasic acid and polyalcohol.

13. The bonding method according to claim 1, wherein the conductive particles include base particles, and a conductive film that covers a surface of the base particles.

14. The bonding method according to claim 1, wherein the conductive particles have an average particle diameter of 0.3 to 100 µm.

15. The bonding method according to claim 1, wherein the bonding film has an average thickness of 0.5 to 500 µm.

16. The bonding method according to claim 1, wherein in steps (3) and (4), energy is imparted to the bonding film by contacting a plasma with the bonding film.

17. The bonding method according to claim 16, wherein the contacting is performed under atmospheric pressure.

18. The bonding method according to claim 16, wherein the contacting is performed by supplying a plasma gas to the bonding film, wherein the plasma gas is produced by introducing a gas between opposing electrodes under applied voltage between the electrodes.

19. The bonding method according to claim 1, wherein the first terminal and the second terminal are subjected in advance to a surface treatment that improves adhesion for the bonding film.

20. A bonding method comprising:
(1) providing a transfer base with a surface that is repellent against a liquid containing a silicone material and conductive particles;
(2) forming a bonding film on the transfer base by:
   (a) applying the liquid to the surface of the transfer base to form a liquid coating in a predetermined shape on the surface; and
   (b) drying the liquid coating to obtain a bonding film having the predetermined shape;
(3) transferring the bonding film from the transfer base to a first base by:
   (a) providing adhesion along a first surface of the bonding film by imparting energy to the bonding film;
   (b) thereafter bonding the first surface of the bonding film to the first base; and
   (c) thereafter separating the bonding film from the transfer base;
(4) obtaining a temporarily bonded structure of the first base and a second base by:
   (a) after the transfer, providing adhesion along a second surface of the bonding film by imparting energy to the bonding film; and
   (b) thereafter bonding the second surface of the bonding film to the second base; and
(5) obtaining a finally bonded structure of the first base and the second base by applying pressure to the temporarily bonded structure so that a first terminal of the first base and a second terminal of the second base are electrically connected via the conductive particles contained in the bonding film.

* * * * *